United States Patent
Lee et al.

(10) Patent No.: US 11,557,635 B2
(45) Date of Patent: Jan. 17, 2023

(54) DISPLAY DEVICE, MASK ASSEMBLY, AND APPARATUS FOR MANUFACTURING THE DISPLAY DEVICE

(71) Applicant: Samsung Display Co., Ltd., Yongin-si (KR)

(72) Inventors: Sangshin Lee, Yongin-si (KR); Jongbum Kim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/899,394

(22) Filed: Jun. 11, 2020

(65) Prior Publication Data
US 2021/0175295 A1    Jun. 10, 2021

(30) Foreign Application Priority Data

Dec. 10, 2019    (KR) .................. 10-2019-0163773

(51) Int. Cl.
*H01L 27/32*    (2006.01)
*H01L 51/56*    (2006.01)
(Continued)

(52) U.S. Cl.
CPC ........ *H01L 27/3218* (2013.01); *C23C 14/042* (2013.01); *H01L 27/3216* (2013.01);
(Continued)

(58) Field of Classification Search
CPC .............. H01L 27/3218; H01L 27/3216; H01L 27/3213; H01L 27/3211
See application file for complete search history.

(56) References Cited

U.S. PATENT DOCUMENTS

| 6,950,115 B2 | 9/2005 | Elliot |
| 7,755,652 B2 | 7/2010 | Credelle et al. |

(Continued)

FOREIGN PATENT DOCUMENTS

| CN | 206076238 U | 4/2017 |
| CN | 206322697 U | 7/2017 |

(Continued)

OTHER PUBLICATIONS

Search Opinion, European Patent Office, EPO App. No. 20212999.5, dated Jul. 6, 2021, all pages (Year: 2021).*

(Continued)

*Primary Examiner* — Victoria K. Hall
(74) *Attorney, Agent, or Firm* — Lewis Roca Rothgerber Christie LLP

(57) ABSTRACT

A display device, a mask assembly, and an apparatus for manufacturing the display device are provided. The display device may reduce glare and includes sub-pixels having accurate and precise patterns. The display device including a first sub-pixel having a quadrangular shape, a second sub-pixel facing a first side of the first sub-pixel, the second sub-pixel having a quadrangular shape, and a third sub-pixel facing the first side of the first sub-pixel and spaced apart from the second sub-pixel, the third sub-pixel having a quadrangular shape, where a distance from the first side of the first sub-pixel to the second sub-pixel and a distance from the first side of the first sub-pixel to the third sub-pixel are different from each other.

54 Claims, 19 Drawing Sheets

(51) Int. Cl.
   *H01L 51/52* (2006.01)
   *C23C 14/04* (2006.01)
   *H01L 51/00* (2006.01)
(52) U.S. Cl.
   CPC ...... *H01L 51/0011* (2013.01); *H01L 51/5237* (2013.01); *H01L 51/56* (2013.01)

(56) References Cited

U.S. PATENT DOCUMENTS

| | | | |
|---|---|---|---|
| 9,013,098 B1* | 4/2015 | Kim | H01L 27/3216 313/504 |
| 9,459,747 B2 | 10/2016 | Donnelly et al. | |
| 9,818,803 B2 | 11/2017 | Lee | |
| 9,935,155 B2 | 4/2018 | Huangfu et al. | |
| 9,993,335 B2 | 6/2018 | Deering et al. | |
| 10,007,968 B2 | 6/2018 | Jo et al. | |
| 10,043,433 B2 | 8/2018 | Sun | |
| 10,104,324 B2 | 10/2018 | Hirota | |
| 10,418,428 B2 | 9/2019 | Jung | |
| 10,563,301 B2 | 2/2020 | Hong | |
| 10,694,129 B2 | 6/2020 | Cote et al. | |
| 11,081,531 B2* | 8/2021 | Cho | H01L 27/3246 |
| 11,257,869 B2* | 2/2022 | Luo | C23C 14/24 |
| 11,302,750 B2* | 4/2022 | Feng | G09G 3/3208 |
| 11,329,103 B2* | 5/2022 | Kim | H01L 27/3218 |
| 11,417,714 B2* | 8/2022 | Lee | H01L 27/3246 |
| 2005/0231447 A1* | 10/2005 | Hu | H01L 27/3276 345/76 |
| 2008/0231554 A1 | 9/2008 | Lee | |
| 2009/0121983 A1* | 5/2009 | Sung | H01L 27/3218 345/76 |
| 2011/0260952 A1* | 10/2011 | Hwang | H01L 27/3218 345/55 |
| 2011/0291549 A1 | 12/2011 | Kim et al. | |
| 2012/0056531 A1* | 3/2012 | Park | G09G 3/3233 313/506 |
| 2012/0193515 A1 | 8/2012 | Agranov et al. | |
| 2013/0057521 A1* | 3/2013 | Kim | H01L 27/3216 345/204 |
| 2014/0065293 A1* | 3/2014 | Kim | C23C 14/042 427/8 |
| 2014/0071030 A1 | 3/2014 | Lee | |
| 2014/0197385 A1* | 7/2014 | Madigan | H01L 51/5056 257/40 |
| 2014/0197396 A1* | 7/2014 | Madigan | H01L 27/3246 257/40 |
| 2014/0198479 A1* | 7/2014 | Chao | H01L 27/3218 362/84 |
| 2014/0284570 A1* | 9/2014 | Jinta | H01L 27/3213 257/40 |
| 2014/0292622 A1* | 10/2014 | Lee | H01L 27/3262 345/80 |
| 2015/0011033 A1* | 1/2015 | Ko | H01L 51/56 438/34 |
| 2015/0015465 A1 | 1/2015 | Gong | |
| 2015/0048322 A1* | 2/2015 | So | H01L 27/3246 257/40 |
| 2015/0070374 A1 | 3/2015 | Gong | |
| 2015/0076455 A1* | 3/2015 | Mizusaki | H01L 51/529 257/40 |
| 2015/0102297 A1* | 4/2015 | Lee | G09G 3/3233 257/40 |
| 2015/0138463 A1* | 5/2015 | Jinta | H01L 27/3246 349/33 |
| 2015/0179713 A1* | 6/2015 | Lee | H01L 27/3216 257/40 |
| 2015/0214280 A1* | 7/2015 | Furuie | H01L 27/3216 257/89 |
| 2015/0270317 A1* | 9/2015 | Lee | H01L 27/3218 257/40 |
| 2015/0311265 A1* | 10/2015 | Matsueda | H01L 27/3211 257/40 |
| 2015/0311268 A1* | 10/2015 | Cheng | H01L 27/3216 257/40 |
| 2015/0380471 A1* | 12/2015 | Guo | G09G 3/20 345/76 |
| 2016/0078807 A1 | 3/2016 | Sun et al. | |
| 2016/0126295 A1* | 5/2016 | Sato | H01L 27/3213 257/89 |
| 2016/0141351 A1* | 5/2016 | You | H01L 27/3276 257/40 |
| 2016/0155777 A1* | 6/2016 | Kabe | G09G 3/32 257/89 |
| 2016/0203748 A1 | 7/2016 | Matsueda et al. | |
| 2016/0225833 A1* | 8/2016 | Kim | H01L 27/3218 |
| 2016/0225834 A1* | 8/2016 | Kim | H01L 27/3258 |
| 2016/0247441 A1 | 8/2016 | Matsueda et al. | |
| 2016/0253972 A1* | 9/2016 | Bai | H01L 27/3216 345/690 |
| 2016/0254327 A1* | 9/2016 | Bai | H01L 27/12 257/40 |
| 2016/0276615 A1* | 9/2016 | Kitabayashi | H01L 51/5265 |
| 2016/0284290 A1 | 9/2016 | Tamaki et al. | |
| 2016/0284769 A1* | 9/2016 | Chien | H01L 27/3216 |
| 2016/0293678 A1 | 10/2016 | Wang | |
| 2016/0293899 A1 | 10/2016 | Hong | |
| 2016/0322432 A1 | 11/2016 | Yang et al. | |
| 2016/0323566 A1 | 11/2016 | Vdovin et al. | |
| 2016/0329385 A1* | 11/2016 | Qiu | H01L 27/3216 |
| 2016/0351116 A1* | 12/2016 | Sun | G09G 3/2003 |
| 2017/0003495 A1 | 1/2017 | De Greef et al. | |
| 2017/0003496 A1 | 1/2017 | De Greef et al. | |
| 2017/0004780 A1 | 1/2017 | De Greef et al. | |
| 2017/0009971 A1 | 1/2017 | Chan et al. | |
| 2017/0052643 A1 | 2/2017 | Iwami | |
| 2017/0104040 A1* | 4/2017 | Huangfu | H01L 27/3216 |
| 2017/0125486 A1* | 5/2017 | Chen | H01L 27/3216 |
| 2017/0133440 A1* | 5/2017 | Wang | H01L 51/0011 |
| 2017/0134650 A1 | 5/2017 | Seger | |
| 2017/0148990 A1 | 5/2017 | Ha | |
| 2017/0170200 A1 | 6/2017 | Ikeda et al. | |
| 2017/0179202 A1* | 6/2017 | Choi | H01L 51/5234 |
| 2017/0200778 A1* | 7/2017 | Jeon | H01L 51/5203 |
| 2017/0207285 A1* | 7/2017 | You | H01L 51/5215 |
| 2017/0250208 A1* | 8/2017 | Kim | H01L 27/3244 |
| 2017/0269413 A1 | 9/2017 | Tamaki et al. | |
| 2017/0317150 A1 | 11/2017 | Chung et al. | |
| 2017/0324917 A1 | 11/2017 | Mlinar et al. | |
| 2017/0369983 A1* | 12/2017 | Yi | C23C 14/042 |
| 2018/0005561 A1* | 1/2018 | Moon | H01L 27/3216 |
| 2018/0007324 A1 | 1/2018 | Chen et al. | |
| 2018/0018047 A1 | 1/2018 | Iwami | |
| 2018/0045968 A1 | 2/2018 | Wu | |
| 2018/0045971 A1 | 2/2018 | Wu | |
| 2018/0062079 A1* | 3/2018 | Ko | H01L 27/3258 |
| 2018/0097038 A1* | 4/2018 | Lee | G06F 3/04164 |
| 2018/0122332 A1 | 5/2018 | Ikeda et al. | |
| 2018/0143358 A1 | 5/2018 | Kawashita et al. | |
| 2018/0158882 A1 | 6/2018 | Kim et al. | |
| 2018/0158889 A1* | 6/2018 | Kim | H01L 27/3218 |
| 2018/0166512 A1* | 6/2018 | Hack | H01L 27/3213 |
| 2018/0190731 A1* | 7/2018 | Park | H01L 27/3218 |
| 2018/0205040 A1 | 7/2018 | Kim | H01L 27/3269 |
| 2018/0210277 A1* | 7/2018 | Wang | G02F 1/133514 |
| 2018/0247984 A1* | 8/2018 | Wang | H01L 27/3216 |
| 2018/0261797 A1* | 9/2018 | Lee | H01L 27/3216 |
| 2018/0269245 A1 | 9/2018 | Mlinar et al. | |
| 2018/0302597 A1 | 10/2018 | Honda | |
| 2018/0308915 A1* | 10/2018 | Motoyama | H01L 27/322 |
| 2018/0312957 A1 | 11/2018 | Zhang | |
| 2019/0074329 A1* | 3/2019 | Kim | H01L 27/3276 |
| 2019/0084986 A1* | 3/2019 | Ye | C07D 409/14 |
| 2019/0131333 A1 | 5/2019 | Borthakur et al. | |
| 2019/0206313 A1 | 7/2019 | Xia et al. | |
| 2019/0206950 A1* | 7/2019 | Chen | G02F 1/133514 |
| 2019/0206951 A1 | 7/2019 | Xin et al. | |
| 2019/0237520 A1 | 8/2019 | Tian | |
| 2019/0252469 A1* | 8/2019 | Xiao | H01L 27/3216 |
| 2019/0271878 A1 | 9/2019 | Tsuruda et al. | |
| 2019/0296093 A1 | 9/2019 | Liu et al. | |
| 2019/0299336 A1 | 10/2019 | Nashner | |

(56) References Cited

U.S. PATENT DOCUMENTS

| | | | |
|---|---|---|---|
| 2019/0302336 A1 | 10/2019 | Fattal et al. | |
| 2019/0302919 A1 | 10/2019 | Clark et al. | |
| 2019/0333418 A1 | 10/2019 | Kawashita | |
| 2019/0339452 A1 | 11/2019 | Fattal et al. | |
| 2019/0340970 A1 | 11/2019 | Kirisken | |
| 2019/0355794 A1* | 11/2019 | Dai | H01L 27/3218 |
| 2019/0355795 A1 | 11/2019 | Liu et al. | |
| 2019/0378882 A1* | 12/2019 | Zhang | H01L 27/3213 |
| 2020/0020676 A1 | 1/2020 | Cok et al. | |
| 2020/0043989 A1 | 2/2020 | Liu et al. | |
| 2020/0043990 A1 | 2/2020 | Huangfu et al. | |
| 2020/0045953 A1 | 2/2020 | Serrat et al. | |
| 2020/0058713 A1 | 2/2020 | Zhang | |
| 2020/0135123 A1 | 4/2020 | Hu et al. | |
| 2020/0161352 A1 | 5/2020 | Takahashi et al. | |
| 2020/0168674 A1 | 5/2020 | Tan et al. | |
| 2020/0227489 A1* | 7/2020 | Kim | H01L 27/323 |
| 2020/0235173 A1* | 7/2020 | Nakamura | H01L 27/3216 |
| 2020/0235174 A1* | 7/2020 | Nakamura | G09F 9/30 |
| 2020/0258441 A1* | 8/2020 | Zhang | G09G 3/2003 |
| 2020/0270739 A1 | 8/2020 | Jin et al. | |
| 2020/0273924 A1* | 8/2020 | Xiao | H01L 27/3218 |
| 2020/0279894 A1* | 9/2020 | Madigan | H01L 51/5206 |
| 2020/0286963 A1* | 9/2020 | Lee | H01L 27/3216 |
| 2020/0321407 A1 | 10/2020 | Tang et al. | |
| 2020/0335717 A1* | 10/2020 | Kim | H01L 51/56 |
| 2020/0350375 A1* | 11/2020 | Zhu | H01L 27/3262 |
| 2020/0357322 A1* | 11/2020 | Wu | H01L 27/3216 |
| 2020/0357861 A1* | 11/2020 | Wang | H01L 27/3216 |
| 2020/0357862 A1* | 11/2020 | Wang | H01L 27/3218 |
| 2020/0363905 A1* | 11/2020 | Jo | H01L 51/0097 |
| 2020/0381492 A1* | 12/2020 | Ryu | H01L 27/3246 |
| 2021/0026209 A1 | 1/2021 | Shin et al. | |
| 2021/0036066 A1 | 2/2021 | Luo et al. | |
| 2021/0050388 A1 | 2/2021 | Song | |
| 2021/0066648 A1* | 3/2021 | Chung | H01L 27/3234 |
| 2021/0067703 A1 | 3/2021 | Kadambala et al. | |
| 2021/0080637 A1 | 3/2021 | Brick et al. | |
| 2021/0083025 A1* | 3/2021 | Nakao | H01L 27/3218 |
| 2021/0091151 A1* | 3/2021 | Lee | H01L 27/3246 |
| 2021/0104578 A1* | 4/2021 | Jo | H01L 51/5284 |
| 2021/0116801 A1 | 4/2021 | Ji | |
| 2021/0134769 A1 | 5/2021 | Kam et al. | |
| 2021/0135149 A1* | 5/2021 | Xin | H01L 51/5228 |
| 2021/0143201 A1 | 5/2021 | Woehler | |
| 2021/0143222 A1 | 5/2021 | Song et al. | |
| 2021/0143230 A1 | 5/2021 | Wang et al. | |
| 2021/0176492 A1 | 6/2021 | Kim | |
| 2021/0191549 A1 | 6/2021 | Kim et al. | |
| 2021/0200386 A1* | 7/2021 | Park | H01L 27/323 |
| 2021/0202653 A1 | 7/2021 | Cho et al. | |
| 2021/0225953 A1* | 7/2021 | Luo | H01L 27/3218 |
| 2021/0241671 A1* | 8/2021 | Lee | H01L 27/3225 |
| 2021/0255476 A1 | 8/2021 | Fattal | |
| 2021/0264823 A1 | 8/2021 | Heo et al. | |
| 2021/0408161 A1* | 12/2021 | Sui | H01L 27/3218 |
| 2022/0013594 A1* | 1/2022 | Wang | H01L 51/5228 |
| 2022/0262871 A1* | 8/2022 | Kim | H01L 51/5253 |

FOREIGN PATENT DOCUMENTS

| | | |
|---|---|---|
| CN | 104992959 B | 2/2018 |
| CN | 207966982 U | 10/2018 |
| EP | 2 940 752 A1 | 11/2015 |
| EP | 3 706 177 A1 | 9/2020 |
| KR | 10-2013-0044993 A | 5/2013 |
| KR | 10-2014-0035239 A | 3/2014 |
| KR | 10-2015-0053161 A | 5/2015 |
| KR | 10-2016-0117846 A | 10/2016 |
| KR | 10-2017-0038294 A | 4/2017 |
| KR | 10-1898366 B1 | 9/2018 |

OTHER PUBLICATIONS

Partial European Search Report, European Patent Office, EPO App. No. 20212999.5, dated Jul. 6, 2021, all pages (Year: 2021).*

European Search Report dated Jul. 6, 2021 issued in corresponding EP Application No. 20212999.5, 18 pages.

U.S. Office Action dated Oct. 15, 2021, issued in U.S. Appl. No. 16/737,637 (21 pages).

EPO Extended European search report dated Aug. 7, 2020, issued in corresponding European Patent Application No. 20159722.6 (15 pages).

U.S. Office Action dated Dec. 16, 2020, issued in U.S. Appl. No. 16/737,637 (28 pages).

U.S. Notice of Allowance from U.S. Appl. No. 16/737,637, dated May 28, 2021, 12 pages.

U.S. Notice of Allowance from U.S. Appl. No. 16/737,637, dated Apr. 20, 2022, 12 pages.

Kim Gu N-Shik; Pixel arrangement of organic light emitting display device ; Nov. 30, 2011; Samsung Mobile Display Corporation; CN102262854 (A) paragraphs 27, 28, figure 1-5 Specification English.

Kim Gu N-Shik; Pixel arrangement of organic light emitting display device ; Nov. 30, 2011; Samsung Mobile Display Corporation; CN102262854 (A) paragraphs 27, 28, figure 1-5 Drawings.

Kim Gu N-Shik; Pixel arrangement of organic light emitting display device ; Nov. 30, 2011; Samsung Mobile Display Corporation; CN102262854 (A) paragraphs 27, 28, figure 1-5 Specification Chinese.

U.S. Office Action dated Jun. 1, 2022, issued in U.S. Appl. No. 16/737,637 (13 pages).

U.S. Notice of Allowance dated Aug. 9, 2022, issued in U.S. Appl. No. 17/492,183 (12 pages).

U.S. Notice of Allowance dated Oct. 24, 2022, issued in U.S. Appl. No. 16/737,637 (13 pages).

U.S. Notice of Allowance dated Nov. 23, 2022, issued in U.S. Appl. No. 17/492,183 (8 pages).

* cited by examiner

DISPLAY DEVICE, MASK ASSEMBLY, AND APPARATUS FOR MANUFACTURING THE DISPLAY DEVICE

CROSS-REFERENCE TO RELATED APPLICATION

This application claims priority to and the benefit of Korean Patent Application No. 10-2019-0163773, filed on Dec. 10, 2019 in the Korean Intellectual Property Office (KIPO), the entire content of which is incorporated herein by reference.

BACKGROUND

1. Field

One or more embodiments relate to a display device, and more particularly, to a display device, a mask assembly, and an apparatus for manufacturing the display device.

2. Description of Related Art

Mobile electronic devices have a wide range of uses. For example, a tablet personal computer (PC) and a small electronic device such as a mobile phone have been recently used as mobile electronic devices.

A mobile electronic device includes a display device for providing visual information such as images or moving images to users in order to support various functions. As components for driving the display device have recently become smaller in size, a portion of the display device that occupies an electronic device has increased in size.

SUMMARY

Aspects of one or more embodiments are directed toward a structure of the display device that may be bent to have a set or predetermined angle from a flat state.

When the existing display device is arranged in a vehicle or the like, glare may occur due to external light reflection or the like in the display device. In addition, in an apparatus for manufacturing the existing display device and a method of manufacturing the display device, a deposition material is deposited on a substrate in a pattern different from the design because deformation of a mask sheet is out of an expected range when the mask sheet is under tension according to a pattern of an opening portion.

Aspects of one or more embodiments are directed toward a display device having a precise pattern while reducing external light reflection, a mask assembly for manufacturing the display device, and an apparatus for manufacturing the display device.

However, these aspects are merely examples and the scope of the present disclosure is not limited thereto.

Additional aspects will be set forth in part in the description which follows and, in part, will be apparent from the description, or may be learned by practice of the presented embodiments of the disclosure.

According to one or more embodiments, a display device includes: a first sub-pixel having a quadrangular shape, a second sub-pixel facing a first side of the first sub-pixel, the second sub-pixel having a quadrangular shape, and a third sub-pixel facing the first side of the first sub-pixel and spaced apart from the second sub-pixel, the third sub-pixel having a quadrangular shape, wherein a distance from the first side of the first sub-pixel to the second sub-pixel and a distance from the first side of the first sub-pixel to the third sub-pixel are different from each other.

At least a side portion of the second sub-pixel and at least a side portion of the third sub-pixel may be within a length range of the first side of the first sub-pixel.

A short side of the second sub-pixel may be parallel to the first side.

A short side of the third sub-pixel may be parallel to the first side of the first sub-pixel.

A plurality of first sub-pixels including the first sub-pixel, the plurality of first sub-pixels including centers arranged in a straight line in a first direction and arranged in a serpentine shape in a second direction.

Each of the plurality of first sub-pixels may emit green light.

The first direction may be a direction parallel to a long side of the display device.

A plurality of second sub-pixels including the second sub-pixel and a plurality of third sub-pixels including the third sub-pixel, wherein centers of first ones of the plurality of second sub-pixels or first ones of the plurality of third sub-pixels may be arranged in a straight line.

A plurality of second sub-pixels including the second sub-pixel and a plurality of third sub-pixels including the third sub-pixel, wherein centers of first ones of the plurality of second sub-pixels or first ones of the plurality of third sub-pixels may be arranged in a serpentine shape in one direction.

A plurality of first sub-pixels including the first sub-pixel may be arranged in a first direction, wherein the second sub-pixel facing the first side and one of another second sub-pixel or another third sub-pixel facing a second side of the first sub-pixel may be symmetrical to each other about a straight line crossing centers of the plurality of first sub-pixels arranged in the first direction.

A length of a long side of the second sub-pixel and a length of a long side of the third sub-pixel may be substantially equal to each other.

The display device may further include a spacer between the first sub-pixel and the second sub-pixel or between the first sub-pixel and the third sub-pixel.

A shortest distance from the second sub-pixel to the spacer may be substantially equal to a shortest distance from another third sub-pixel to the spacer.

A short side of the second sub-pixel or a short side of the third sub-pixel may overlap one side of the first sub-pixel and may be arranged in a straight line extending from one side of another first sub-pixel.

A plurality of first sub-pixels including the first sub-pixel may be arranged in a first direction, wherein a long side of the second sub-pixel or a long side of the third sub-pixel may form an angle of about 45 degrees with respect to a straight line crossing centers of the plurality of first sub-pixels arranged in the first direction.

An area of the first sub-pixel may be greater than at least one of an area of the second sub-pixel or an area of the third sub-pixel.

An area of the second sub-pixel and an area of the third sub-pixel may be different from each other.

An outline connecting a portion of an edge of the second sub-pixel to a portion of an edge of the third sub-pixel may be square.

A vertex of at least one of the first sub-pixel, the second sub-pixel, or the third sub-pixel may be chamfered.

The first sub-pixel may emit blue color light, one of the second sub-pixel and the third sub-pixel may emit red color light, and the other of the second sub-pixel and the third sub-pixel may emit green color light.

According to one or more embodiments, a display device includes: a plurality of first intermediate layers having quadrangular shapes and spaced apart from each other, a plurality of second intermediate layers having quadrangular shapes and spaced apart from each other, the plurality of second intermediate layers facing the plurality of first intermediate layers, respectively, and a plurality of third intermediate layers having quadrangular shapes and spaced apart from each other, the plurality of third intermediate layers facing the plurality of first intermediate layers, respectively, and being spaced apart from the plurality of second intermediate layers, wherein a distance from a side of each of the first intermediate layers to each of the second intermediate layers and a distance from the side of each of the first intermediate layers to each of the third intermediate layers are different from each other.

The first intermediate layer, the second intermediate layer, and the third intermediate layer may include materials to emit light of different colors in response to power supplied to each of the intermediate layers.

The second intermediate layer and the third intermediate layer may be parallel to each other.

Centers of first ones of the plurality of second intermediate layers or centers of some of the plurality of third intermediate layers may be arranged in a straight line.

A length of a long side of the second intermediate layer and a length of a long side of the third intermediate layer may be substantially equal to each other.

The display device may further include a spacer between the first intermediate layer and the second intermediate layer or between the first intermediate layer and the third intermediate layer.

Shortest distances between second intermediate layers, which face a same first intermediate layer from among the plurality of second intermediate layers, and the same first intermediate layer, or shortest distances between third intermediate layers, which face a same first intermediate layer from among the plurality of third intermediate layers, and the same first intermediate layer may be different from each other.

According to one or more embodiments, a mask assembly includes: a mask frame, and a plurality of mask sheets on the mask frame under tension and sequentially arranged along a side of the mask frame, wherein each of the plurality of mask sheets includes a plurality of openings, wherein a first one of the plurality of openings is tilted in one direction with respect to a tensile direction of the mask sheet, the a second one of the plurality of openings is tilted in a different direction from the first one of the plurality of openings, and centers of at least three of the plurality of openings are arranged in a serpentine shape in one direction.

Each of the plurality of openings may be at an angle of about 45 degrees with respect to the tensile direction of the mask sheet.

Centers of openings in the tensile direction of the mask sheet or a direction perpendicular to the tensile direction of the mask sheet from among the plurality of openings may be arranged in a line.

Centers of openings in the tensile direction of the mask sheet or a direction perpendicular to the tensile direction of the mask sheet from among the plurality of openings may be arranged in a serpentine shape.

Each of the plurality of openings may be square or rectangular.

A vertex of each of the plurality of openings may be chamfered.

According to one or more embodiments, an apparatus for manufacturing a display device includes: a chamber configured to receive a display substrate is arranged, a deposition source in the chamber, the deposition source being configured to supply a deposition material into the chamber, and a mask assembly configured to face the deposition source to pass the deposition material through the display substrate in a pattern form, wherein the mask assembly includes: a mask frame, and a plurality of mask sheets arranged on the mask frame under tension and sequentially arranged along a side of the mask frame, wherein each of the plurality of mask sheets includes a plurality of openings, wherein a first one of the plurality of openings is tilted in one direction with respect to a tensile direction of the mask sheet, a second one of the plurality of openings is tilted in a different direction from the first one of the plurality of openings, and centers of at least three of the plurality of openings are arranged in a serpentine shape in one direction.

Each of the plurality of openings may be at an angle of about 45 degrees with respect to the tensile direction.

Centers of openings arranged in the tensile direction of the mask sheet or a direction perpendicular to the tensile direction of the mask sheet from among the plurality of openings may be arranged in a line.

Centers of openings arranged in the tensile direction of the mask sheet or a direction perpendicular to the tensile direction of the mask sheet from among the plurality of openings may be arranged in a serpentine shape.

Each of the plurality of openings may be square or rectangular.

A vertex of each of the plurality of openings may be chamfered.

According to one or more embodiments, a display device includes: a first sub-pixel, a second sub-pixel facing the first sub-pixel, a third sub-pixel facing the first sub-pixel and spaced apart from the second sub-pixel, and a spacer between the first sub-pixel and the second sub-pixel or between the first sub-pixel and the third sub-pixel, wherein a distance from a side of the first sub-pixel facing the second sub-pixel and the third sub-pixel to the second sub-pixel is different from a distance from the side of the first sub-pixel to the third sub-pixel.

A size of the second sub-pixel may be substantially equal to a size of the third sub-pixel.

A size of the second sub-pixel may be different from a size of the third sub-pixel.

Each of the second sub-pixel and the third sub-pixel may be rectangular, wherein a length of a long side of the second sub-pixel and a length of a long side of the third sub-pixel may be substantially equal to each other.

A shortest distance from an edge of the spacer to the second sub-pixel and a shortest distance from the edge of the spacer to another third sub-pixel may be substantially equal to each other.

A shortest distance between one of the second sub-pixel or another third sub-pixel and an edge of the spacer may be substantially equal to a shortest distance between the first sub-pixel and an edge of the spacer.

Each of the second sub-pixel and the third sub-pixel may be rectangular, wherein a distance between long sides of another first sub-pixel and the second sub-pixel facing each other, a distance between a long side of the second sub-pixel and a long side of the third sub-pixel facing each other, and a distance between a long side of the third sub-pixel and the another first sub-pixel facing each other may be substantially equal to one another.

The above and other aspects, features, and advantages of example embodiments of the disclosure will be more apparent from the following description, the accompanying drawings, and claims.

This general and specific aspect may be implemented by a system, a method, a computer program, or a certain combination of a system, a method, a computer program.

BRIEF DESCRIPTION OF THE DRAWINGS

The above and other aspects, features, and advantages of example embodiments of the disclosure will be more apparent from the following description taken in conjunction with the accompanying drawings, in which.

DETAILED DESCRIPTION

Figure 1:
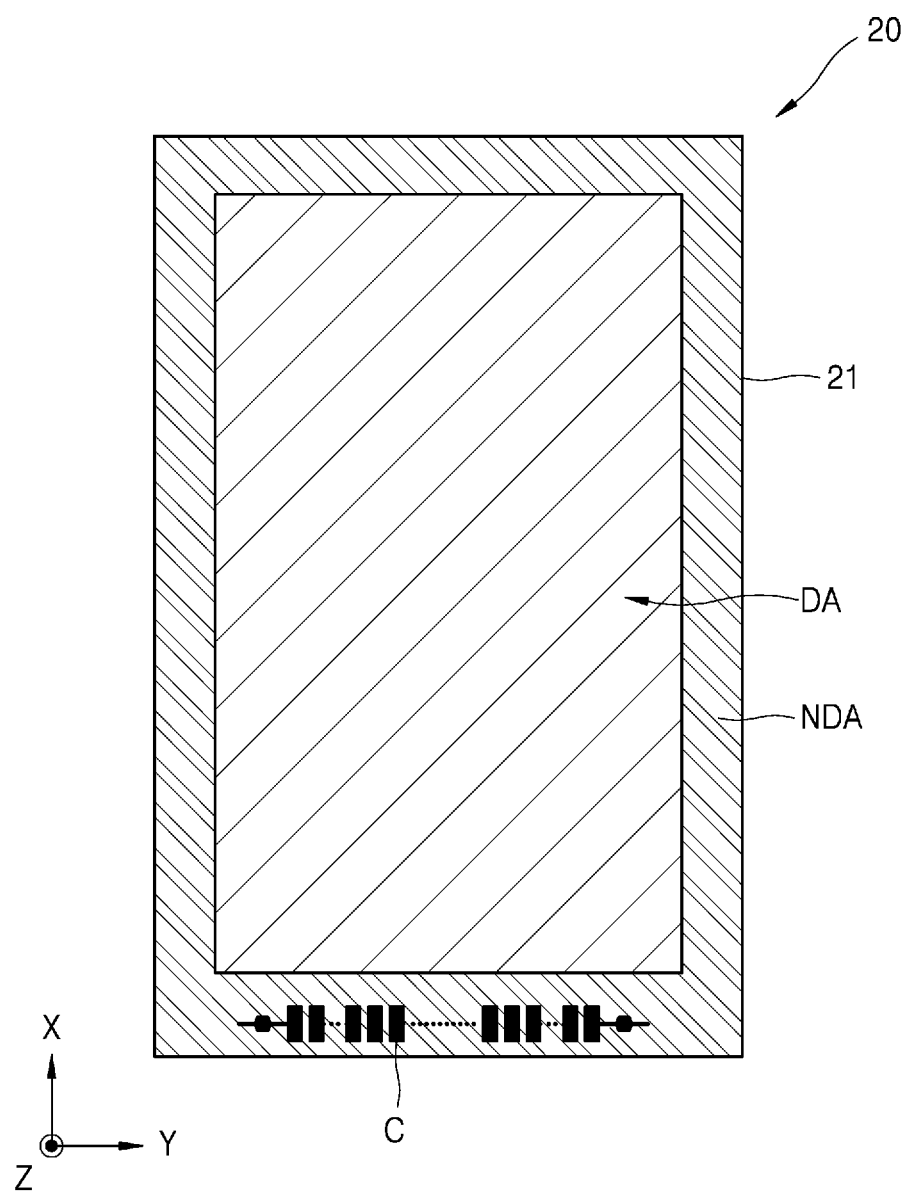
FIG. 1 is a plan view of a display device according to an embodiment.

Reference will now be made in more detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items.

Throughout the disclosure, the expression "at least one of a, b or c" indicates only a, only b, only c, both a and b, both a and c, both b and c, all of a, b, and c, or variations thereof.

Hereinafter, the present embodiments are described in more detail with reference to the accompanying drawings. In the drawings, the same reference numerals are given to the same or corresponding elements, and repeated description thereof is omitted.

It will be understood that although terms such as "first" and "second" may be used herein to describe various components, these components should not be limited by these terms and these terms are only used to distinguish one component from another component.

Also, as used herein, the singular forms "a," "an," and "the" are intended to include the plural forms as well, unless the context clearly indicates otherwise.

Also, it will be understood that the terms "comprise," "include," and "have" used herein specify the presence of stated features or components, but do not preclude the presence or addition of one or more other features or components.

Further, the use of "may" when describing embodiments of the present disclosure refers to "one or more embodiments of the present disclosure".

Also, it will be understood that when a layer, region, or component is referred to as being "located on" another layer, region, or component, it may be "directly" or "indirectly" located on the other layer, region, or component, that is, for example, one or more intervening layers, regions, or components may be located therebetween.

Sizes of components in the drawings may be exaggerated for convenience of description. In other words, because the sizes and thicknesses of components in the drawings are arbitrarily illustrated for convenience of description, the present disclosure is not limited thereto.

The x-axis, the y-axis, and the z-axis are not limited to three axes of the rectangular coordinate system and may be interpreted in a broader sense. For example, the x axis, the y axis, and the z axis may be perpendicular to each other, or may represent different directions that are not perpendicular to each other.

As used herein, the phrases such as "a plan view" may refer to a view from top or from a direction normal to the display area of the display device.

Spatially relative terms, such as "beneath," "below," "lower," "above," "upper," "bottom," "top" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" or "over" the other elements or features. Thus, the term "below" may encompass both an orientation of above and below. The device may be otherwise oriented (rotated 90 degrees or at other orientations), and the spatially relative descriptors used herein should be interpreted accordingly.

As used herein, the terms "substantially", "about", and similar terms are used as terms of approximation and not as terms of degree, and are intended to account for the inherent deviations in measured or calculated values that would be recognized by those of ordinary skill in the art.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

When an example embodiment may be implemented differently, a particular process order may be performed differently from the described order. For example, two consecutively described processes may be performed substantially at the same time or performed in an order opposite to the described order.

Figure 2:
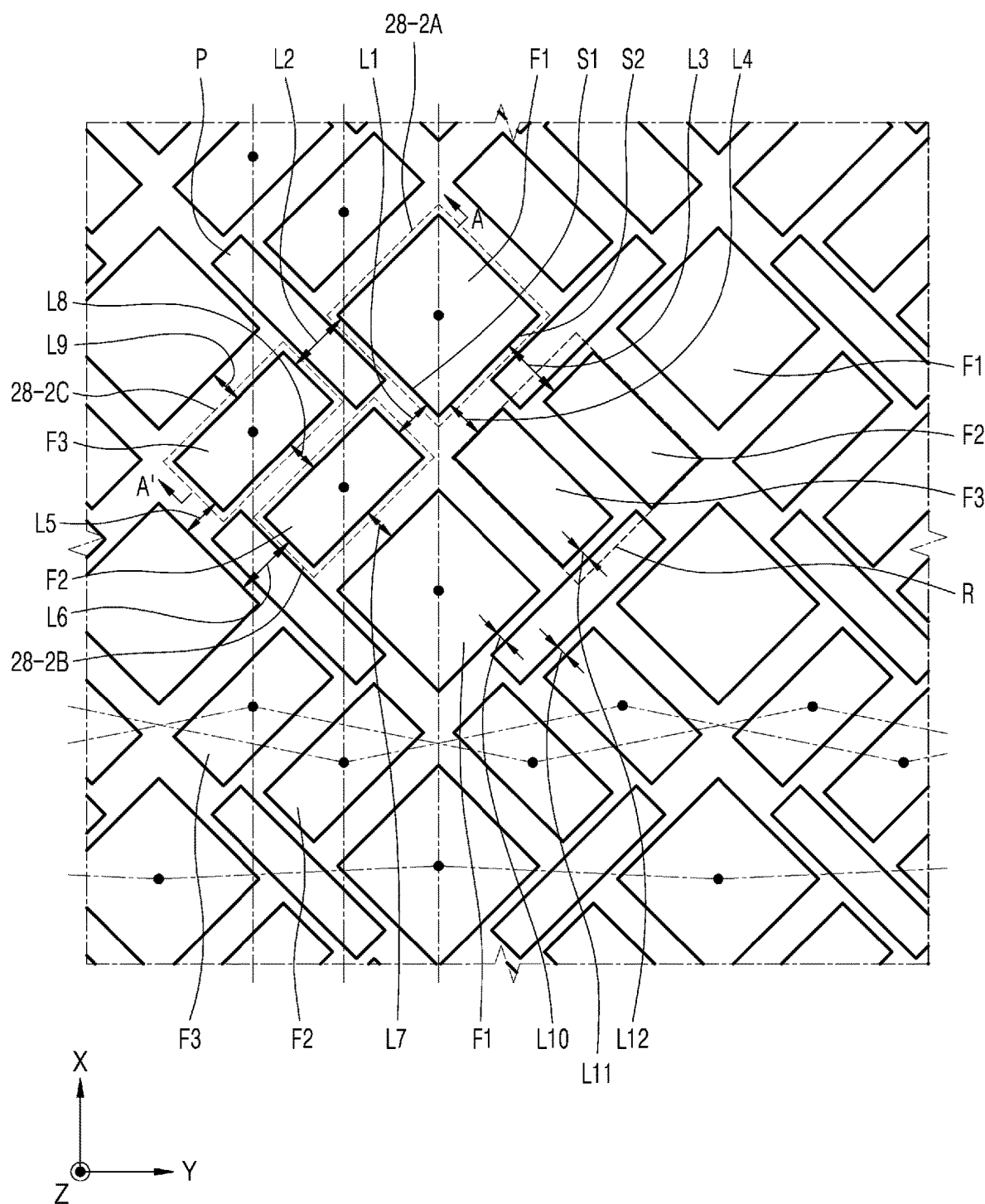
FIG. 2 is a plan view illustrating a first sub-pixel, a second sub-pixel, and a third sub-pixel of the display device shown in FIG. 1.
Figure 3:
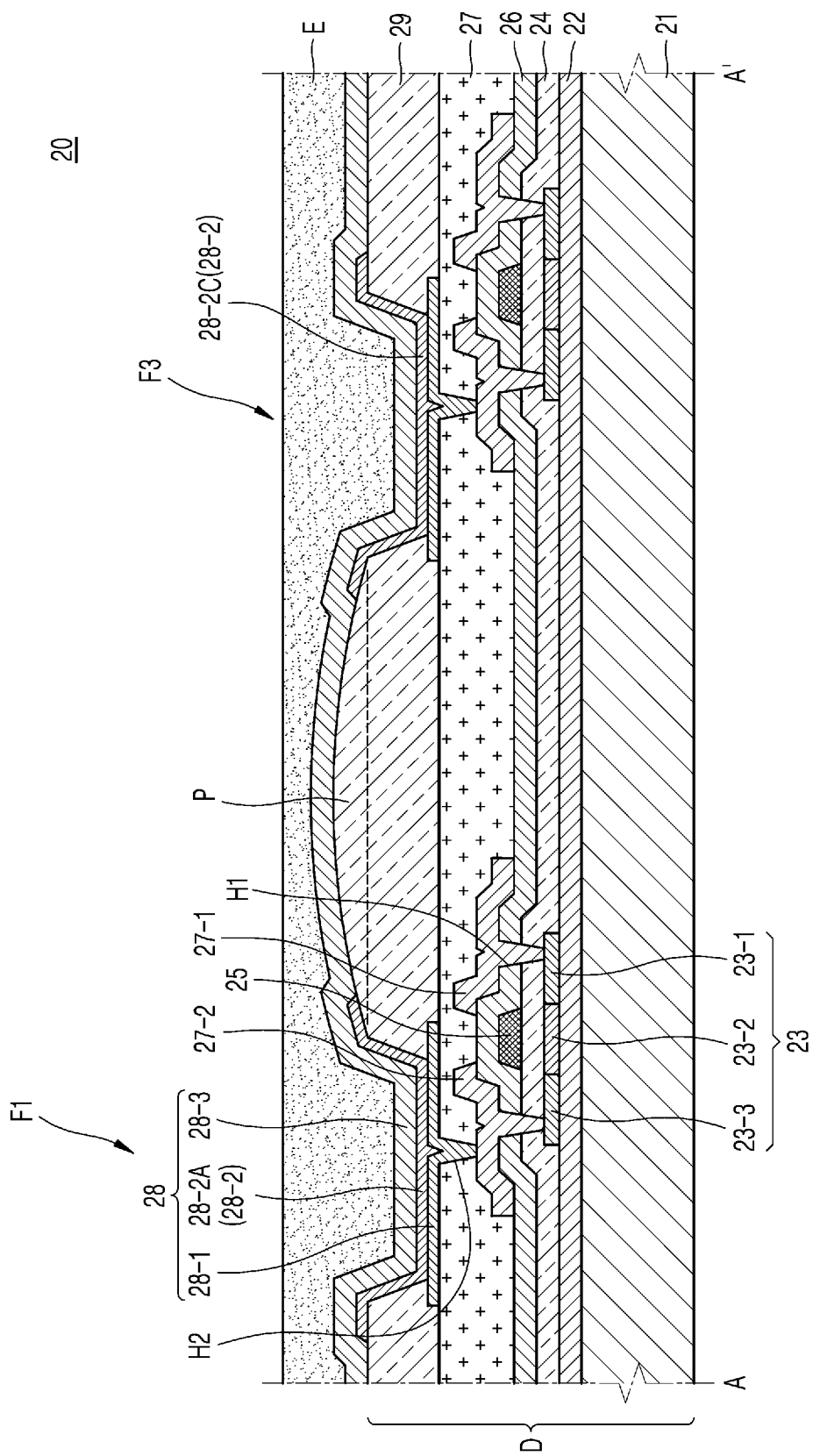
FIG. 3 is a cross-sectional view of the display device taken along the line A-A' of FIG. 2.

FIG. 1 is a plan view of a display device according to an embodiment. FIG. 2 is a plan view illustrating a first sub-pixel, a second sub-pixel, and a third sub-pixel of the display device shown in FIG. 1. FIG. 3 is a cross-sectional view of the display device taken along the line A-A' of FIG. 2.

Referring to FIGS. 1 and 3, a display device 20 may include a display area DA and a non-display area NDA defined on a substrate 21, the non-display area NDA being around the display area DA. A light-emitting portion may be arranged in the display area DA, and a power line and the like may be arranged in the non-display area NDA. Furthermore, a pad portion C may be arranged in the non-display area NDA. In one or more embodiments, the pad portion C may be adjacent to one side of the non-display area NDA.

The display area DA may have various suitable shapes. For example, the display area DA may have a shape such as a rectangle, a square, a polygon, or a circle. In one or more embodiments, the display area DA may have an irregular shape other than a rectangle, a square, a polygon, a circle, and the like. However, for convenience of description, one or more embodiments where the display area DA has a rectangular shape will be described in more detail below.

The display device 20 may include a display substrate D and a thin-film encapsulation layer E. The display device 20 may include the substrate 21, a thin-film transistor TFT, a passivation film 27, and a pixel electrode 28-1. In another embodiment, the display substrate D may include a portion of the substrate 21, the thin-film transistor TFT, the passivation film 27, the pixel electrode 28-1, and an intermediate layer 28-2.

The substrate 21 may include a plastic material, and/or a metal material such as stainless steel (SUS) and/or titanium. The substrate 21 may include a high molecular resin, such as polyethersulfone, polyacrylate, polyetherimide, polyethylene naphthalate, polyethylene terephthalate, polyphenylene sulfide, polyarylate, polyimide, polycarbonate, and/or cellulose acetate propionate. The substrate 21 may have a single layer or multilayer structure including the material. In the case of the multilayer structure, the substrate 21 may further include an inorganic layer. For convenience of description, one or more embodiments where the substrate 21 includes polyimide will be described in more detail below.

The thin-film transistor TFT may be formed on the substrate 21, the passivation film 27 may be formed to cover the thin-film transistor TFT, and an organic light-emitting device 28 may be formed on the passivation film 27.

A buffer layer 22 may be further formed on a top surface of the substrate 21, the buffer layer 22 including an organic compound and/or an inorganic compound (e.g., SiOx (x≥1) or SiNx (x≥1)).

After an active layer 23 is formed on the buffer layer 22 in a predetermined or set pattern, the active layer 23 may be covered by a gate insulating layer 24. The active layer 23 includes a source region 23-1, a drain region 23-3, and a channel region 23-2 between the source region 23-1 and the drain region 23-3.

The active layer 23 may include various suitable materials. For example, the active layer 23 may include an inorganic semiconductor material such as amorphous silicon or crystalline silicon. In one or more embodiments, the active layer 23 may include an oxide semiconductor. In one or more embodiments, the active layer 23 may include an organic semiconductor material. However, for convenience of description, one or more embodiments where the active layer 23 includes amorphous silicon will be described in more detail below.

The active layer 23 may be formed by forming an amorphous silicon film on the buffer layer 22, crystallizing the amorphous silicon film into a polycrystalline silicon film, and patterning the polycrystalline silicon film. The source region 23-1 and the drain region 23-3 of the active layer 23 may be doped with impurities according to a type of the thin-film transistor TFT such as a driving thin-film transistor or a switching thin-film transistor.

A gate electrode 25 that corresponds to the active layer 23 and an interlayer insulating layer 26 that covers the gate electrode 25 may be formed on a top surface of the gate insulating layer 24.

After contact holes (e.g., contact hole H1) are formed in or through the interlayer insulating layer 26 and the gate insulating layer 24, a source electrode 27-1 and a drain electrode 27-2 may be formed on the interlayer insulating layer 26 to respectively contact the source region 23-1 and the drain region 23-3 through the contact holes. In one or more embodiments, the source electrode 27-1 and the drain electrode 27-2 fill corresponding contact holes formed in or through the interlayer insulating layer 26 and the gate insulating layer 24.

The passivation film 27 may be formed on the thin-film transistor TFT, and a pixel electrode 28-1 of the organic light-emitting device 28 may be formed on the passivation film 27. The pixel electrode 28-1 may contact the drain electrode 27-2 of the thin-film transistor TFT through a via hole H2 formed in or through the passivation film 27. The passivation film 27 may include an inorganic material and/or an organic material and have a single-layer structure or a multi-layer structure. The passivation film 27 may be formed as a planarization film having a flat top surface regardless of a shape (e.g., curved shape) of a lower film below the passivation film 27. In another embodiment, the passivation film 27 may be curved along the shape (e.g., curved shape) of the lower film. In other words, the upper surface of the passivation film 27 may be flat or may correspond to the shape of the film below the passivation film 27. The passivation film 27 may include a transparent insulator to achieve a resonance effect.

After the pixel electrode 28-1 is formed on the passivation film 27, a pixel-defining layer 29 may be formed of an organic material and/or an inorganic material to cover the pixel electrode 28-1 and the passivation film 27. The pixel-defining layer 29 may have an opening to expose the pixel electrode 28-1. In other words, the pixel-defining layer 29 may define an opening that exposes a top surface of the pixel electrode 28-1.

The intermediate layer 28-2 and an opposite electrode 28-3 may be formed on at least the pixel electrode 28-1. In other words, the intermediate layer 28-2 may be formed on the pixel electrode 28-1 and the opposite electrode 28-3 may be formed on the intermediate layer 28-2. In another embodiment, the opposite electrode 28-3 may be formed on the entire surface of the display substrate D. The opposite electrode 28-3 may be formed on the intermediate layer 28-2 and the pixel-defining layer 29. Hereinafter, for convenience of description, one or more embodiments where the opposite electrode 28-3 is formed on the intermediate layer 28-2 and the pixel-defining layer 29 will be described in more detail.

The pixel electrode 28-1 may function as an anode, and the opposite electrode 28-3 may function as a cathode. Polarities of the pixel electrode 28-1 and the opposite electrode 28-3 may be switched.

The pixel electrode 28-1 and the opposite electrode 28-3 may be insulated from each other by the intermediate layer 28-2, and voltages of different polarities may be applied to the intermediate layer 28-2 such that an organic emission layer emits light.

The intermediate layer 28-2 may include an organic emission layer. In one or more embodiments, the intermediate layer 28-2 may include an organic emission layer and at least one of a hole injection layer (HIL), a hole transport layer (HTL), an electron transport layer (ETL), or an electron injection layer (EIL). However, the present embodiment is not limited thereto. In another embodiment, the intermediate layer 28-2 may include an organic emission layer and various suitable functional layer(s).

A plurality of intermediate layers 28-2 may be provided, and the plurality of intermediate layers 28-2 may form the display area DA (e.g., form a part of the display area DA). The plurality of intermediate layers 28-2 may be arranged to be spaced apart from each other in the display area DA.

One unit pixel may include a plurality of sub-pixels. The plurality of sub-pixels may emit light of various suitable colors. In one or more embodiments, one sub-pixel may refer to a region in which light having one color is emitted. In another embodiment, one sub-pixel may refer to a portion of the pixel electrode 28-1 that is exposed to the outside through an open area of the pixel-defining layer 29. In one or more embodiments, the open area of the pixel-defining layer 29 corresponds to a bottom of an opening of the pixel-defining layer 29 that extends through the pixel-defining layer 29 to expose a portion of the pixel electrode 28-1. In this case, adjusting the size of one sub-pixel may be achieved by adjusting the area of the portion of the pixel electrode 28-1 that is exposed to the outside by adjusting the size of an open area of the pixel-defining layer 29. In other words, adjusting the size of one sub-pixel may be achieved by adjusting a size of the opening extending through the pixel-defining layer 29. Hereinafter, for convenience of description, one or more embodiments where one sub-pixel is a region in which light having one color is emitted will be described in more detail.

The plurality of sub-pixels may include sub-pixels emitting red, green, and blue light, respectively. In another embodiment, the plurality of sub-pixels may include sub-pixels emitting red, green, blue, and white light, respectively. In another embodiment, the plurality of sub-pixels may include sub-pixels emitting red, yellow, and blue light, respectively. The plurality of sub-pixels are not limited to those described above, and may include all suitable variations of cases including sub-pixels emitting light of colors different from each other. Hereinafter, for convenience of description, one or more embodiments where a plurality of sub-pixels include sub-pixels emitting blue light, red light, and green light, respectively will be described in more detail.

Referring to FIG. 2, the plurality of sub-pixels may include a first sub-pixel F1, a second sub-pixel F2, and a third sub-pixel F3. Each of the first sub-pixel F1, the second sub-pixel F2, and the third sub-pixel F3 may have a quadrangular shape. In one or more embodiments, one of the first sub-pixel F1, the second sub-pixel F2, and the third sub-pixel F3 may have a quadrangle having four sides having substantially the same length, and the other two of the first sub-pixel F1, the second sub-pixel F2, and the third sub-pixel F3 may have quadrangles each having two pairs of sides having substantially the same length. In other words, one of the first sub-pixel F1, the second sub-pixel F2, and the third sub-pixel F3 may be substantially square or rhombus-shaped, and the other two of the first sub-pixel F1, the second sub-pixel F2, and the third sub-pixel F3 may be substantially rectangular. For example, as illustrated in FIG. 2, the first sub-pixel F1 is substantially square or rhombus-shaped and the second sub-pixel F2 and the third sub-pixel F3 are substantially rectangular. As used herein, substantially a square (or a rhombus) may refer to a quadrangle having a shape in which the remaining sides other than one reference side of all sides of the quadrangle have lengths within a certain or set error range from the one reference side. In one or more embodiments, substantially a rectangle may be referred to a quadrangle having a shape in which one of a pair of sides facing each other has a length within a certain or set error range based on the other of the pair of sides facing each other. For example, the first sub-pixel F1, the second sub-pixel F2, and the third sub-pixel F3 may be formed in a substantially square or rectangular shape as described above through a deposition process to be described in more detail below. In one or more embodiments, the first sub-pixel F1, the second sub-pixel F2, or the third sub-pixel F3 may be substantially square (or rhombus) or rectangular in shape and have rounded or chamfered corners. In one or more embodiments, in the first sub-pixel F1, the second sub-pixel F2, or the third sub-pixel F3, the angles of corners formed by the sides connected to each other may not be equal to 90 degrees and may be within a certain or set error range. Hereinafter, for convenience of description, the terms "square" and "rectangle" are used, but these terms should be understood as concepts that include "substantially square" and "substantially rectangle," respectively.

Hereinafter, for convenience of description, one or more embodiments where the first sub-pixel F1 is square and the second sub-pixel F2 and the third sub-pixel F3 are rectangular will be described in more detail.

One of the first sub-pixel F1, the second sub-pixel F2, and the third sub-pixel F3 emits blue light, another one of the first sub-pixel F1, the second sub-pixel F2, and the third sub-pixel F3 emits red light, and the other of the first sub-pixel F1, the second sub-pixel F2, and the third sub-pixel F3 emits green light. In this case, depending on the shape of each of the first sub-pixel F1, the second sub-pixel F2, and the third sub-pixel F3, one of the blue light, the red light, and the green light may be square, and the other two of the blue light, the red light, and the green light may be rectangular. Hereinafter, for convenience of description, one or more embodiments where the first sub-pixel F1 emits blue light, the second sub-pixel F2 emits red light, and the third sub-pixel F3 emits green light will be described in more detail. However, embodiments of the present disclosure are not limited to the above, for example, the first sub-pixel F1 may emit green light.

The area of each of the first sub-pixel F1, the second sub-pixel F2, and the third sub-pixel F3 may vary. In this case, because an aperture ratio of each of the sub-pixels may be adjusted, the display device 20 may be formed to perform various suitable operations in various suitable forms.

The first sub-pixel F1, the second sub-pixel F2, and the third sub-pixel F3 may include a first intermediate layer 28-2A, a second intermediate layer 28-2B, and a third intermediate layer 28-2C, respectively. In one or more embodiments, the first intermediate layer 28-2A, the second intermediate layer 28-2B, and the third intermediate layer 28-2C may include materials (e.g., organic emission layers) that emit different light when external power is applied thereto. In other words, the first intermediate layer 28-2A, the second intermediate layer 28-2B, and the third intermediate layer 28-2C may include materials (e.g., organic emission layers) that emit different light (e.g., light of different colors) in response to power supplied to each of the intermediate layers.

The first intermediate layer 28-2A, the second intermediate layer 28-2B, and the third intermediate layer 28-2C may correspond to the shapes of the first sub-pixel F1, the second sub-pixel F2, and the third sub-pixel F3, respectively. For example, the first intermediate layer 28-2A may have a square shape corresponding to a square shape of the first sub-pixel F1. Furthermore, the second intermediate layer 28-2B and the third intermediate layer 28-2C may have rectangular shapes corresponding to rectangular shapes of the second sub-pixel F2 and the third sub-pixel F3, respectively. In one or more embodiments, the planar area of each of the intermediate layers may be the same as or different from the planar area of each of the sub-pixels. For example, in one or more embodiments, the planar area of the first intermediate layer 28-2A may be different from the planar area of the first sub-pixel F1, the planar area of the second intermediate layer 28-2B may be the same as the planar area of the second sub-pixel F2, and the planar area of the third intermediate layer 28-2C may be the same as the planar area of the third sub-pixel F3. In another embodiment, the planar area of the second intermediate layer 28-2B may be different from the planar area of the second sub-pixel F2, the planar area of the first intermediate layer 28-2A may be the same as the planar area of the first sub-pixel F1, and the planar area of the third intermediate layer 28-2C may be the same as the planar area of the third sub-pixel F3. In another embodiment, the planar area of the third intermediate layer 28-2C may be different from the planar area of the third sub-pixel F3, the planar area of the second intermediate layer 28-2B may be the same as the planar area of the second sub-pixel F2, and the planar area of the first intermediate layer 28-2A may be the same as the planar area of the first sub-pixel F1. In another embodiment, the planar area of the first intermediate layer 28-2A may be the same as the planar area of the first sub-pixel F1, the planar area of the second intermediate layer 28-2B may be different from the planar area of the second sub-pixel F2, and the planar area of the third intermediate layer 28-2C may be different from the planar area of the third sub-pixel F3. In another embodiment, the planar area of the second intermediate layer 28-2B may be the same as the planar area of the second sub-pixel F2, the planar area of the first intermediate layer 28-2A may be different from the planar area of the first sub-pixel F1, and the planar area of the third intermediate layer 28-2C may be different from the planar area of the third sub-pixel F3. In another embodiment, the planar area of the third intermediate layer 28-2C may be the same as the planar area of the third sub-pixel F3, the planar area of the first intermediate layer 28-2A may be different from the planar area of the first sub-pixel F1, and the planar area of the second intermediate layer 28-2B may be different from the planar area of the second sub-pixel F2. In another embodiment, the planar area of the first intermediate layer 28-2A may be different from the planar area of the first sub-pixel F1, the planar area of the second intermediate layer 28-2B may be different from the planar area of the second sub-pixel F2, and the planar area of the third intermediate layer 28-2C may be different from the planar area of the third sub-pixel F3. In another embodiment, the planar area of the first intermediate layer 28-2A may be the same as the planar area of the first sub-pixel F1, the planar area of the second intermediate layer 28-2B may be the same as the planar area of the second sub-pixel F2, and the planar area of the third intermediate layer 28-2C may be the same as the planar area of the third sub-pixel F3. In one or more embodiments, the planar area may be an area on a plane formed by the display area DA of the display device 20. Alternatively, in one or more embodiments, the planar area may be an area on a plane on which an image is to be implemented (or provided) when the image is implemented (or provided). Hereinafter, for convenience of description, one or more embodiments where the planar area of each intermediate layer is different from the planar area of each sub-pixel will be described in more detail.

In one or more embodiments, the planar area of each sub-pixel may be less than the planar area of each intermediate layer. In this case, because each intermediate layer may be formed by deposition on the display substrate D to have sufficient margin for each sub-pixel, light having an accurate shape may be emitted from each sub-pixel.

Because a relationship between each of the sub-pixels and a relationship between each of the intermediate layers are the same or similar to each other, for convenience of description, the relationship between each of the sub-pixels will be described in more detail below.

A plurality of first sub-pixels F1, a plurality of second sub-pixels F2, and a plurality of third sub-pixels F3 may be provided. In one or more embodiments, the plurality of first sub-pixels F1 may be spaced apart from each other in at least one of a first direction or a second direction. For example, some of the plurality of first sub-pixels F1 may be arranged to be spaced apart from each other in a first direction (e.g., one of an X-axis direction and a Y-axis direction in FIG. 1), and the other ones of the plurality of first sub-pixels F1 may be arranged to be spaced apart from each other in a second direction (e.g., the other of the X-axis direction and the Y-axis direction in FIG. 1). Hereinafter, for convenience of description, one or more embodiments where the first direction refers to the X-axis direction of FIG. 1 and the second direction refers to the Y-axis direction of FIG. 2 will be described in more detail.

Centers of first sub-pixels F1 that are arranged in the first direction from among the plurality of first sub-pixels F1 may be arranged on one straight line (e.g., as illustrated in FIG. 2). In one or more embodiments, the first sub-pixels F1 arranged in the first direction from among the plurality of first sub-pixels F1 may be arranged in a line (or a straight line) in the first direction (e.g., the X-axis direction). The first direction may be a direction perpendicular or normal to a direction in which a user on the side of the display device 20 views the display device 20. For example, the first direction may be a direction parallel to a long side of the display device 20 or a short side of the display device 20. For example, when the display device 20 is fixed or attached to a position adjacent to a window of a vehicle, in one or more embodiments, the long side of the display device 20 is parallel to the window (e.g., the plane of the window) of the vehicle and the short side of the display device 20 is not parallel to the window (e.g., the plane of the window) of the vehicle. In this case, the first direction may be parallel to the short side of the display device 20 and the long sides of the display device 20 may be arranged (e.g., based on a viewing angle) up and down inside the vehicle. In another embodiment, the short side of the display device 20 is parallel to the window (e.g., the plane of the window) of the vehicle and the long side of the display device 20 is not parallel to the window (e.g., the plane of the window) of the vehicle. In this case, the first direction may be parallel to the long side of the display device 20 and the short sides of the display device 20 may be arranged (e.g., based on a viewing angle) up and down inside the vehicle. Hereinafter, for convenience of description, one or more embodiments where the first direction is parallel to the long side of the display device 20 will be described in more detail.

In one or more embodiments, the first sub-pixel F1 may emit green light having high visibility. In one or more embodiments, when the first sub-pixel F1 emits green light, the visibility of letters in an image implemented in (or provided by) the display device 20 may be improved. In one or more embodiments, centers of first sub-pixels F1 arranged in the second direction from among the plurality of first sub-pixels F1 may not be arranged on one straight line and may be arranged in a serpentine (or zigzag) shape (e.g., as illustrated in FIG. 2).

A first side S1 and a second side S2 of each of the first sub-pixels F1 may form a certain or set angle with each other. For example, the first side S1 and the second side S2 of the first sub-pixel F1 may form a right angle with each other. In one or more embodiments, the first side S1 and the second side S2 may be arranged to be tilted in different directions with respect to at least one of the first direction or the second direction, respectively. Accordingly, each of the first sub-pixels F1 may be arranged in a rhombic form with respect to one of the first direction and the second direction, and an angle formed by the two sides S1 and S2 adjacent to each of the vertexes of each of the first sub-pixels F1 may be 90 degrees. For example, each of the first sub-pixels F1 may have a square shape.

In one or more embodiments, one second sub-pixel F2 and one third sub-pixel F3 may be arranged on the first side S1 or the second side S2 of one first sub-pixel F1 to face the first sub-pixel F1. In one or more embodiments, the second sub-pixel F2 and the third sub-pixel F3 may be arranged to be tilted with respect to one of the first direction and the second direction. For example, the second sub-pixel F2 and the third sub-pixel F3 may be tilted to form an angle of 45 degrees or about 45 degrees with respect to one of the first direction and the second direction. In other words, at least one of a short side or a long side of at least one of the second sub-pixel F2 or the third sub-pixel F3 may form an angle of 45 degrees or about 45 degrees with respect to a straight line connecting or crossing centers of a plurality of first sub-pixels F1 arranged in the first direction (e.g., as illustrated in FIG. 2).

The second sub-pixel F2 and the third sub-pixel F3 may have rectangular shapes. In one or more embodiments, the area of at least one of the second sub-pixel F2 or the third sub-pixel F3 may be less than the area of the first sub-pixel F1. Furthermore, at least one of the second sub-pixel F2 or the third sub-pixel F3 facing the first sub-pixel F1 may be arranged to overlap one side (e.g., the first side S1 or the second side S2) of the first sub-pixel F1 facing the second sub-pixel F2 and the third sub-pixel F3 or may be arranged to overlap an extension line of the one side of the first sub-pixel F1 (in a direction parallel to a plane defined by the X axis and the Y axis). For example, at least a side portion of the second sub-pixel F2 and at least a side portion of the third sub-pixel F3 adjacent to each other may be arranged within a length range of one of the first side S1 or the second side S2.

A short side or a long side of at least one of the second sub-pixel F2 or the third sub-pixel F3 facing the first sub-pixel F1 may be parallel to the first side S1 or the second side S2. In one or more embodiments, extension lines of short sides of different second sub-pixels F2 respectively facing the first side S1 and the second side S2 may intersect with each other, or extension lines of long sides of the second sub-pixels F2 respectively facing the first side S1 and the second side S2 may intersect with each other. In another embodiment, extension lines of short sides of a plurality of third sub-pixels F3 respectively facing the first side S1 and the second side S2 may intersect with each other, or extension lines of long sides of the third sub-pixels F3 respectively facing the first side S1 and the second side S2 may intersect with each other. In another embodiment, the extension line of a short side of the second sub-pixel F2 facing the first side S1 and the extension line of a short side of the third sub-pixel F3 facing the second side S2 may intersect with each other, or the extension line of a long side of the second sub-pixel F2 facing the first side S1 and the extension line of a long side of the third sub-pixel F3 facing the second side S2 may intersect with each other. In another embodiment, the extension line of a long side of the second sub-pixel F2 facing the first side S1 and the extension line of a short side of the third sub-pixel F3 facing the second side S2 may intersect with each other, or the extension line of a short side of the second sub-pixel F2 facing the first side S1 and the extension line of a long side of the third sub-pixel F3 facing the second side S2 may intersect with each other.

The plurality of second sub-pixels F2 may be spaced apart from each other in at least one of the first direction or the second direction. In one or more embodiments, centers of some of a plurality of second sub-pixels F2 arranged in one of the first direction and the second direction may be arranged in a straight line, and centers of the other ones of the plurality of second sub-pixels F2 arranged in the other of the first direction and the second direction may be arranged in a serpentine (or zigzag) shape (e.g., as illustrated in FIG. 2). Hereinafter, for convenience of description, one or more embodiments where centers of some of a plurality of second sub-pixels F2 arranged in the first direction are arranged in a straight line and centers of the other ones of a plurality of second sub-pixels F2 arranged in the second direction are arranged in a serpentine shape will be described in more detail.

The plurality of third sub-pixels F3 may also be arranged to be spaced apart from each other in at least one of the first direction or the second direction similar to the second sub-pixels F2. In this case, the plurality of third sub-pixels F3 may also be arranged similar to the second sub-pixels F2. Hereinafter, for convenience of description, one or more embodiments where centers of some of a plurality of third sub-pixels F3 arranged in the first direction from among the plurality of third sub-pixels F3 are arranged in a straight line and centers of the other ones of a plurality of third sub-pixels F3 arranged in the second direction from among the plurality of third sub-pixels F3 are arranged in a serpentine shape will be described in more detail.

In one or more embodiments, one of the second sub-pixel F2 and the third sub-pixel F3 facing the first side S1 of the first sub-pixel F1 may be arranged to be symmetrical with one of the second sub-pixel F2 and the third sub-pixel F3 facing the second side S2 of the first sub-pixel F1 with respect to or about a straight line (e.g., a straight line parallel to the first direction passing through or crossing centers of two adjacent sub-pixels) connecting or crossing centers of first sub-pixels F1 arranged in the first direction. For example, the second sub-pixel F2 facing the first side S1 may be symmetrical with the third sub-pixel F3 facing the second side S2 with respect to or about the straight line. Also, the third sub-pixel F3 facing the first side S1 may be symmetrical with the second sub-pixel F2 facing the second side S2 with respect to or about the straight line. A distance between the centers of adjacent second sub-pixels F2 (e.g., adjacent second sub-pixels F2 in the first direction) may be the same as a distance between the centers of adjacent third sub-pixels F3 (e.g., adjacent third sub-pixels F3 in the first direction). In another embodiment, the second sub-pixel F2 and the third sub-pixel F3 facing the first side S1 may be symmetrical with the second sub-pixel F2 and the third sub-pixel F3 facing the second side S2, respectively. For example, the second sub-pixel F2 and the third sub-pixel F3 facing the first side S1 may be symmetrical with the third sub-pixel F3 and the second sub-pixel F2 facing the second side S2 with respect to or about a straight line connecting or crossing centers of first sub-pixels F1 arranged in the first direction. A distance between centers of one of a pair of second sub-pixels F2 and a pair of third sub-pixels F3 arranged symmetrically with respect to each other may be less than a distance between centers of the other of the pair of second sub-pixels F2 and the pair of third sub-pixels F3 arranged symmetrically with respect to each other. In one or more embodiments, a pair of second sub-pixels F2 adjacent to each other may be arranged between a pair of third sub-pixels F3 adjacent to each other or the pair of third sub-pixels F3 adjacent to each other may be arranged between the pair of second sub-pixels F2 adjacent to each other. However, hereinafter, for convenience of description, one or more embodiments where the second sub-pixel F2 and the third sub-pixel F3 are arranged to be symmetrical with each other with respect to or about a straight line connecting or crossing centers of first sub-pixels F1 arranged in the first direction will be described in more detail.

The second sub-pixel F2 and the third sub-pixel F3 may have the same size. For example, the planar area of the second sub-pixel F2 may be equal to or substantially equal to the planar area of the third sub-pixel F3. In one or more embodiments, the length of a short side of the second sub-pixel F2 may be equal to or substantially to the length of a short side of the third sub-pixel F3, and the length of a long side of the second sub-pixel F2 may be equal to or substantially equal to the length of a long side of the third sub-pixel F3. In one or more embodiments, the second intermediate layer 28-2B and the third intermediate layer 28-2C respectively arranged in the second sub-pixel F2 and the third sub-pixel F3 may also have the same size similar to the second sub-pixel F2 and the third sub-pixel F3.

The shortest distances from two sub-pixels facing one side of the first sub-pixel F1 to the one side of the first sub-pixel F1 may be different from each other. For example, a first distance L1 that is the shortest distance from an edge of the first sub-pixel F1 to the second sub-pixel F2 and a second distance L2 that is the shortest distance from the edge of the first sub-pixel F1 to the third sub-pixel F3 may be different from each other (e.g., as illustrated in FIG. 2). For example, the first distance L1 may be less than the second distance L2. In one or more embodiments, the shortest distance may be measured from the first side S1 or the second side S2 to one side of the second sub-pixel F2 or one side of the third sub-pixel F3 in a direction perpendicular or normal to one of the first side S1 and the second side S2. Alternatively, in another embodiment, the shortest distance may be measured from the first side S1 or the second side S2 to one side of the second sub-pixel F2 or one side of the third sub-pixel F3 in a direction perpendicular or normal to an extension line of one of the first side S1 and the second side S2. However, hereinafter, for convenience of description, one or more embodiments where the shortest distance is a distance measured from the first side S1 or the extension line of the first side S1 to the second sub-pixel F2 or the third sub-pixel F3 facing the first side S1 will be described in more detail. In another embodiment, the shortest distance may be measured as a distance from a center of the first sub-pixel F1 to a center of the second sub-pixel F2 or a distance from the center of the first sub-pixel F1 to a center of the third sub-pixel F3. In another embodiment, the shortest distance may be measured as a distance from the first side S1 of the first sub-pixel F1 or the extension line of the first side S1 to a center of the second sub-pixel F2 or to a center of the third sub-pixel F3.

In one or more embodiments, distances from edges (or sides) of one of a second sub-pixel F2 and a third sub-pixel F3 facing the same first sub-pixel F1 to an edge (or one side) of the first sub-pixel F1 may be different from each other. For example, a first distance L1 from a short side of a second sub-pixel F2 facing the first side S1 of the first sub-pixel F1 to the first side S1 may be different from a third distance L3 from a short side of a second sub-pixel F2 facing the second side S2 to the second side S2. In one or more embodiments, a second distance L2 from a short side of a third sub-pixel F3 facing the first side S1 of the first sub-pixel F1 to the first side S1 may be different from a fourth distance L4 from a short side of a third sub-pixel F3 facing the second side S2 to the second side S1. In one or more embodiments, the third distance L3 may be equal to or substantially equal to the second distance L2, and the fourth distance L4 may be equal to or substantially equal to the first distance L1.

Furthermore, the shortest distances from an edge of one of a second sub-pixel F2 and a third sub-pixel F3 arranged between adjacent first sub-pixels F1 to edges of first sub-pixels F1 that are different from each other. For example, the first distance L1 from a short side of a second sub-pixel F2 facing the first side S1 of the first sub-pixel F1 to the first side S1 may be different from a sixth distance L6 from a short side of a second sub-pixel F2 facing one side of another adjacent first sub-pixel F1 to the one side of the other adjacent first sub-pixel F1. In one or more embodiments, the second distance L2 from a short side of a third sub-pixel F3 facing the first side S1 of the first sub-pixel F1 to the first side S1 may be different from a fifth distance L5 from a short side of a third sub-pixel F3 facing one side of another adjacent first sub-pixel F1 to the one side of the other adjacent first sub-pixel F1. In one or more embodiments, the above relationship or description may be the same in a long side of the second sub-pixel F2 and a long side of the third sub-pixel F3, and may be equally applied to the first intermediate layer 28-2A, the second intermediate layer 28-2B, and the third intermediate layer 28-2C.

In one or more embodiments, a seventh distance L7 between one side of the first sub-pixel F1 and a long side of the second sub-pixel F2 which face each other, an eighth distance L8 between a long side of the second sub-pixel F2 and a long side of the third sub-pixel F3 which face each other, and a ninth distance L9 between a long side of the third sub-pixel F3 and one side of the first sub-pixel F1 which face each other may be equal to or substantially equal to one another. In one or more embodiments, each of the seventh distance L7, the eight distance L8, and the ninth distance L9 may be greater than or equal to the first distance L1 and less than the second distance L2. For example, the distances described above may maintain the rigidity of a mask sheet, which will be described in more detail later, by providing a width of a mask sheet portion arranged between openings of the mask sheet. In one or more embodiments, intermediate layers may be prevented or substantially prevented from overlapping (e.g., overlapping in the Z-axis direction) or from being connected to each other through or based on the distances.

An outline R connecting a portion of an edge of the second sub-pixel F2 facing one side of the first sub-pixel F1 to a portion of the third sub-pixel F3 may be square. For example, the outline R may be drawn by connecting the remaining edge of the second sub-pixel F2 and the remaining edge of the third sub-pixel F3 excluding one side of the second sub-pixel F2 and one side of the third sub-pixel F3 in which the second sub-pixel F2 and the third sub-pixel F3 face each other and by connecting a vertex of the second sub-pixel F2 and a vertex of the third sub-pixel F3 facing each other at a portion where the second sub-pixel F2 and the third sub-pixel F3 are apart from each other (e.g., as illustrated in FIG. 2). The outline R forms a square, and thus, the second sub-pixel F2 and the third sub-pixel F3 may be arranged at the second side S2 by rotating the second sub-pixel F2 and the third sub-pixel F3 arranged at the first side S1 so that the arrangement of the third sub-pixel F3 and the second sub-pixel F2 arranged at the second side S2 may correspond to the arrangement of the second sub-pixel F2 and the third sub-pixel F3 facing the first side S1.

The first intermediate layer 28-2A, the second intermediate layer 28-2B, and the third intermediate layer 28-2C respectively forming the first sub-pixel F1, the second sub-pixel F2, and the third sub-pixel F3 may be formed and arranged to be the same as or similar to the first sub-pixel F1, the second sub-pixel F2, and the third sub-pixel F3, respectively. The centers of the first intermediate layer 28-2A, the second intermediate layer 28-2B, and the third intermediate layer 28-2C may be arranged at positions that are the same as or different from those of the centers of the first sub-pixel F1, the second sub-pixel F2, and the third sub-pixel F3, respectively. The descriptions of the first sub-pixel F1, the second sub-pixel F2, and the third sub-pixel F3 given above may be applied to the first intermediate layer 28-2A, the second intermediate layer 28-2B, and the third intermediate layer 28-2C, respectively.

A spacer P may be arranged between the first sub-pixel F1 and the second sub-pixel F2 and/or between the first sub-pixel F1 and the third sub-pixel F3. In one or more embodiments, the spacer P may be arranged on the pixel-defining layer 29 or integrally formed with the pixel-defining layer 29. The spacer P may have various suitable shapes. For example, a plurality of spacers P may be formed in the form of protrusions, and the plurality of spacers P may be arranged to be spaced apart from each other on the pixel-defining layer 29. In another embodiment, one spacer P may be provided in a space between sub-pixels adjacent to each other (or between intermediate layers adjacent to each other). In one or more embodiments, the spacer P is not limited to the above, and when each of mask sheets enters an opening of the pixel-defining layer 29 or a deposition material is deposited on the display substrate D, the mask sheet may be in close contact with the pixel-defining layer 29 and contact the display substrate D to thereby prevent or substantially prevent the occurrence of a defect in which a portion of the display substrate D is damaged or broken. For example, the spacer P may maintain a gap between the end of an opening area of the pixel-defining layer 29 and each mask assembly when the mask assembly is in close contact with the display substrate D. In one or more embodiments, the spacer P may be arranged so as not to overlap each of the intermediate layers. Hereinafter, for convenience of description, one or more embodiments where the spacer P is arranged between the first side S1 of the first sub-pixel F1 and the second sub-pixel F2 and between the second side S2 of the first sub-pixel F1 and the third sub-pixel F3 will be described in more detail.

The spacer P as described above may be integrally formed concurrently (e.g., simultaneously) with the pixel-defining layer 29 when the pixel-defining layer 29 is formed, or may be separately formed on the pixel-defining layer 29 after the pixel-defining layer 29 is formed. In one or more embodiments, the spacer P may use a material that is the same as or different from that of the pixel-defining layer 29. Hereinafter, for convenience of description, one or more embodiments where the spacer P uses a material that is the same as that of the pixel-defining layer 29 will be described in more detail.

Distances from sub-pixels facing the edge of the spacer P to the edge of the spacer P may be the same or substantially the same. For example, a tenth distance L10 from one side of the first sub-pixel F1 facing the edge of the spacer P to the edge of the spacer P, an eleventh distance L11 from a short side of the second sub-pixel F2 facing the edge of the spacer P to the edge of the spacer P, and a twelfth distance L12 from a short side of the third sub-pixel F3 facing the edge of the spacer P to the edge of the spacer P may be equal to or substantially equal to one another.

An apparatus for manufacturing a display device to be described in more detail below may form various suitable layers on the display substrate D. For example, the apparatus for manufacturing the display device may form at least one of the intermediate layers 28-2 on the display substrate D. In more detail, the apparatus for manufacturing the display device may form at least one of an organic emission layer, a hole injection layer, a hole transport layer, an electron injection layer, an electron transport layer, or a functional layer in the intermediate layer 28-2. In one or more embodiments, when the apparatus for manufacturing the display device forms at least one of the layers in the intermediate layer 28-2 on the display substrate D, the apparatus for manufacturing the display device may manufacture one layer through a plurality of deposition materials or may concurrently (e.g., simultaneously) manufacture a plurality of layers. The thin-film encapsulation layer E may include a plurality of inorganic layers or may include an inorganic layer and an organic layer.

The organic layer of the thin-film encapsulation layer E may be formed of a polymer and may include polyethylene terephthalate, polyethylene naphthalate, polycarbonate, polyimide, polyethylene sulfonate, polyoxymethylene, polyarylate, hexamethyldisiloxane, acrylic resin (e.g., polymethyl methacrylate, polyacrylic acid, etc.), or any combination thereof.

The inorganic layer of the thin-film encapsulation layer E may be a single layer or stacked layer including a metal oxide or a metal nitride. In more detail, the inorganic layer may include one of SiNx, $Al_2O_3$, $SiO_2$, and/or $TiO_2$.

An uppermost layer of the thin-film encapsulation layer E that is exposed to the outside may include an inorganic layer in order to prevent or substantially prevent moisture from penetrating into an organic light-emitting device.

In one or more embodiments, the thin-film encapsulation layer E may include at least one sandwich structure in which at least one organic layer is inserted between at least two inorganic layers. In one or more embodiments, the thin-film encapsulation layer E may include at least one sandwich structure in which at least one inorganic layer is between at least two organic layers. In one or more embodiments, the thin-film encapsulation layer E may include a sandwich structure in which at least one organic layer is between at least two inorganic layers and a sandwich structure in which at least one inorganic layer is between at least two organic layers.

For example, the thin-film encapsulation layer E may sequentially include a first inorganic layer, a first organic layer, and a second inorganic layer from an upper portion of the organic light-emitting device.

As another example, the thin-film encapsulation layer E may sequentially include a first inorganic layer, a first organic layer, a second inorganic layer, a second organic layer, and a third inorganic layer from an upper portion of the organic light-emitting device.

As another example, the thin-film encapsulation layer E may sequentially include a first inorganic layer, a first organic layer, a second inorganic layer, a second organic layer, a third inorganic layer, a third organic layer, and a fourth inorganic layer from an upper portion of the organic light-emitting device.

A halogenated metal layer including LiF may be between the organic light-emitting device and the first inorganic layer. The halogenated metal layer may prevent or substantially prevent the organic-light emitting device from being damaged when the first inorganic layer is formed by sputtering.

The area of the first organic layer may be less than the area of the second inorganic layer, and the area of the second organic layer may also be less than the area of the third inorganic layer.

When a plurality of inorganic layers are provided as described above, the inorganic layers may be deposited to be in direct contact with each other in or at an edge region of the display device 20, and organic layers may not be exposed to the outside.

The display device 20 as described above may be fixed or attached to a device such as a vehicle for moving a user. In other words, the display device 20 may be mounted inside a vehicle, for example, at a dashboard of the vehicle. The display device 20 may be fixed or attached to the device to form an angle different from 0 degrees between a user's viewing direction and the first direction or the second direction. In other words, the display area DA of the display device 20 may face the user. For example, the display device 20 may be arranged such that the user's viewing direction of the display device 20 and the first direction or the second direction form an angle of 90 degrees. In one or more embodiments, each of the sub-pixels may be arranged tilted with respect to the user's viewing direction (e.g., the Y-axis direction in FIG. 1), as described above. Hereinafter, for convenience of description, one or more embodiments where the user's viewing direction of the display device 20 and the first direction form an angle of 90 degrees will be described in more detail.

In the above case, when a user looks at the display device 20, an inclined portion of the pixel-defining layer 29 is not perpendicular or normal to the user's viewing direction. Accordingly, external light may be prevented or substantially prevented from being reflected through the inclined portion of the pixel-defining layer 29 and incident on the user's eyes. In other words, the inclined portion may prevent or substantially prevent external light being reflected into the user's eyes.

Furthermore, the display device 20 may implement (or provide) a precise image through each sub-pixel.

Figure 4:
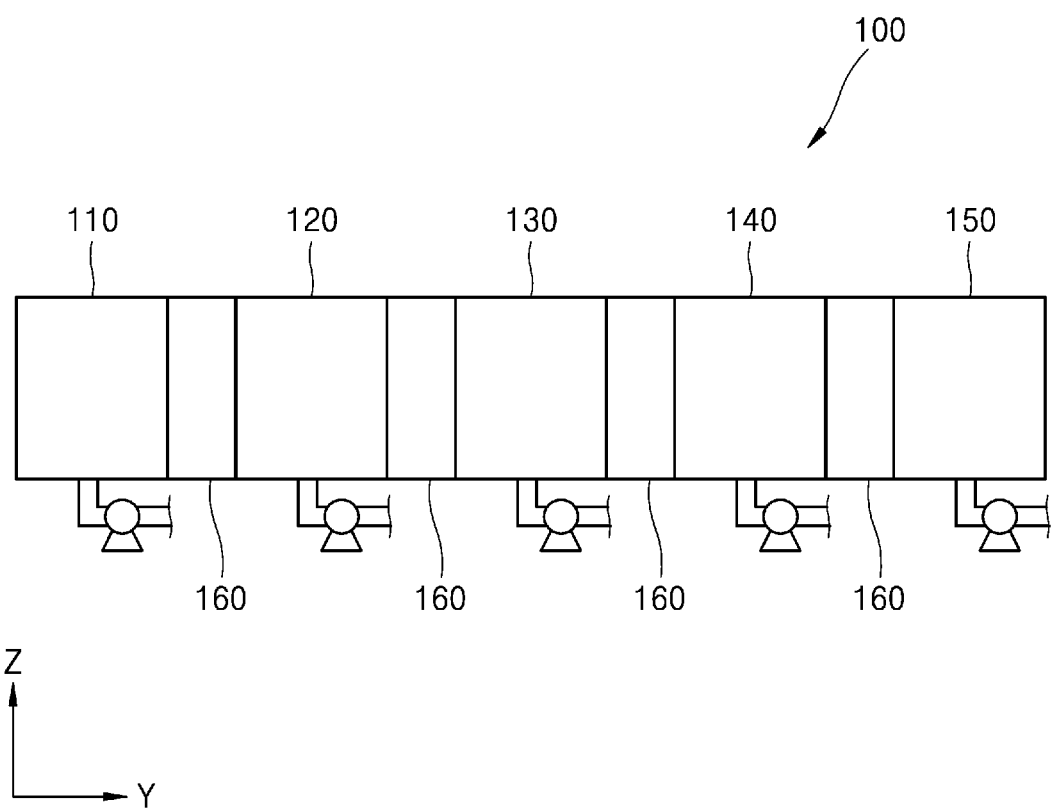
FIG. 4 is a front view of an apparatus for manufacturing the display device shown in FIG. 1.
Figure 5:
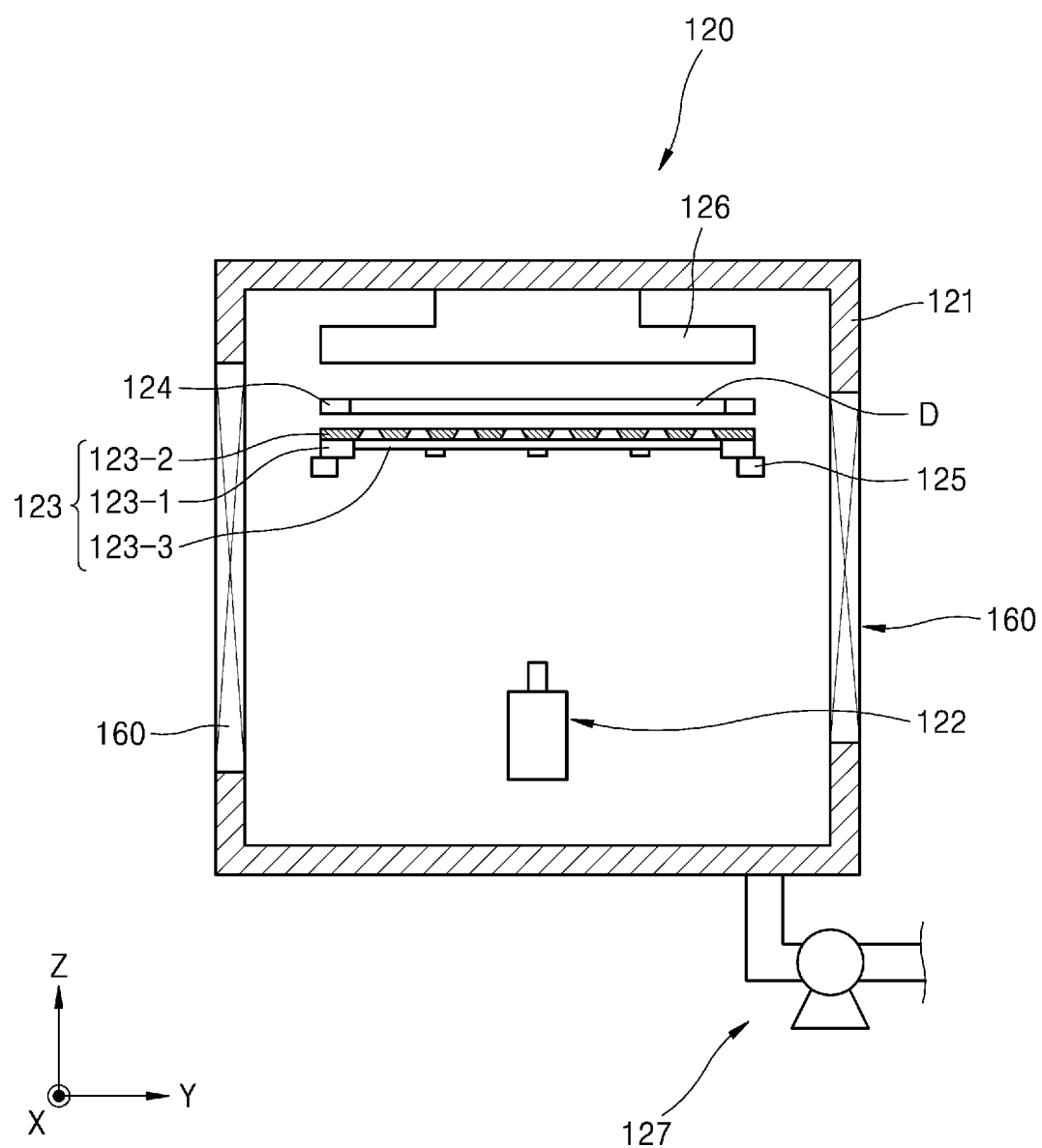
FIG. 5 is a cross-sectional view of a first deposition unit shown in FIG. 4.
Figure 6:
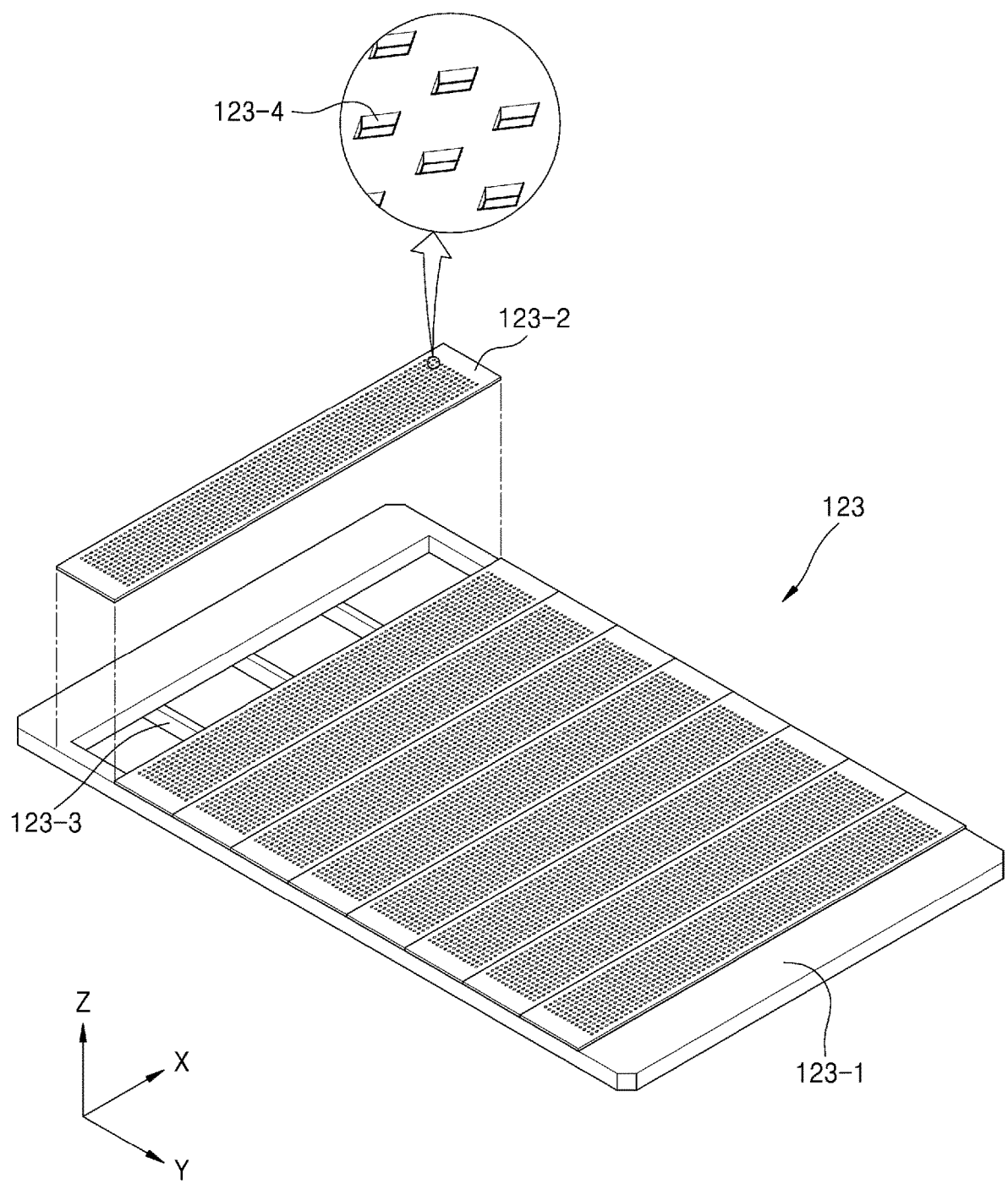
FIG. 6 is a perspective view of a first mask assembly shown in FIG. 5.
Figure 7:
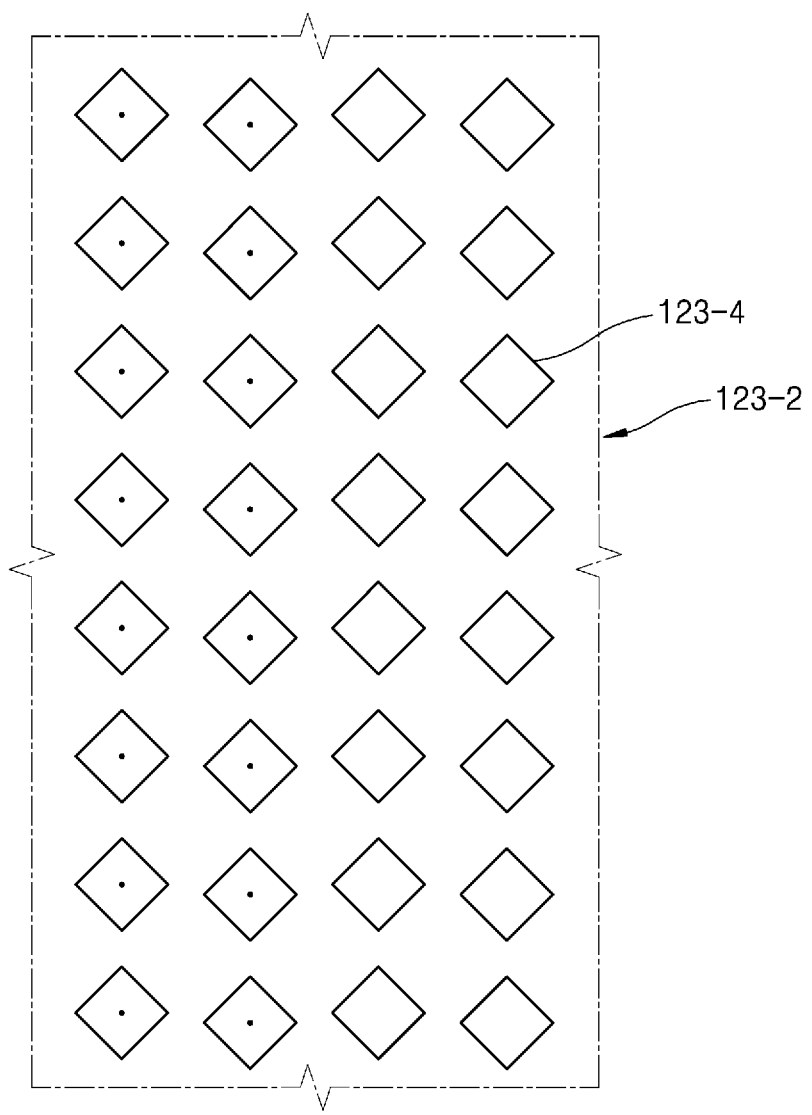
FIG. 7 is a plan view of a portion of a first mask sheet shown in FIG. 6.
Figure 8:
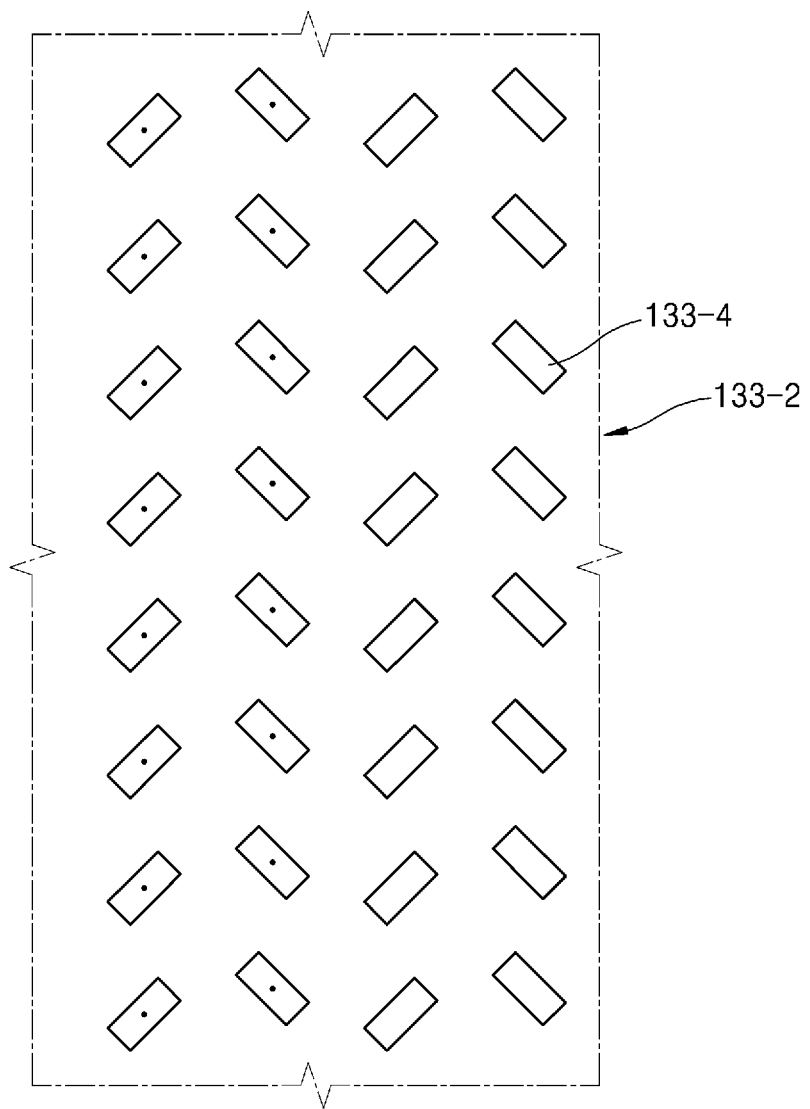
FIG. 8 is a plan view of a portion of a second mask sheet used in a second deposition unit shown in FIG. 4.
Figure 9:
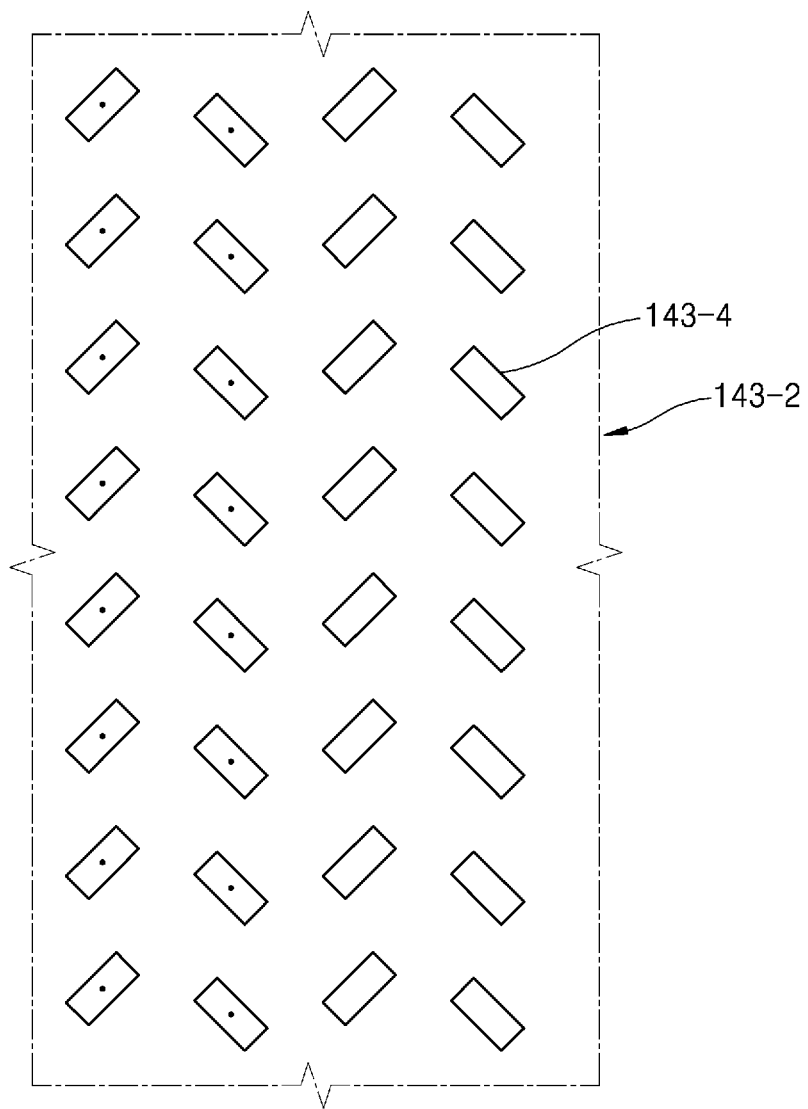
FIG. 9 is a plan view of a portion of a third mask sheet used in a third deposition unit shown in FIG. 4.

FIG. 4 is a front view of an apparatus for manufacturing the display device 20 shown in FIG. 1. FIG. 5 is a cross-sectional view of a first deposition unit shown in FIG. 4. FIG. 6 is a perspective view of a first mask assembly shown in FIG. 5. FIG. 7 is a plan view of a portion of a first mask sheet shown in FIG. 6. FIG. 8 is a plan view of a portion of a second mask sheet used in a second deposition unit shown in FIG. 4. FIG. 9 is a plan view of a portion of a third mask sheet used in a third deposition unit shown in FIG. 4.

Referring to FIGS. 4-9, an apparatus 100 for manufacturing a display device (hereinafter, referred to as a display device manufacturing apparatus) may include a device for loading the display substrate D, a device for manufacturing the display substrate D, a device to form an intermediate layer on the display substrate D, a device to form an opposite electrode on the display substrate D, a device to form a thin-film encapsulation layer on the display substrate D, a device for unloading the display substrate D, and the like. In one or more embodiments, the display device manufacturing apparatus 100 may be formed by connecting the above-described devices in an in-line form. In another embodiment, in the display device manufacturing apparatus 100, only some of the devices described above may be arranged in an in-line form, and the other ones of the devices may be arranged to be separated from a portion of the in-line form. In another embodiment, the display device manufacturing apparatus 100 may also be formed by arranging the devices separately. However, hereinafter, for convenience of description, one or more embodiments where the display device manufacturing apparatus 100 includes the device for loading the display substrate D, the device to form an intermediate layer, and the device for unloading the display substrate D will be described in more detail.

The display device manufacturing apparatus 100 may include a loading unit 110, a first deposition unit 120, a second deposition unit 130, a third deposition unit 140, and an unloading unit 150. In one or more embodiments, the display device manufacturing apparatus 100 may include a shielding unit 160 arranged between devices connected to each other to disconnect or connect the spaces of the devices. In other words, the shielding unit 160 may function as a partition between the loading unit 110, the first deposition unit 120, the second deposition unit 130, the third deposition unit 140, and/or the unloading unit 150.

The first deposition unit 120, the second deposition unit 130, and the third deposition unit 140 may deposit a first intermediate layer, a second intermediate layer, and a third intermediate layer on the display substrate D in various suitable orders. For example, the first deposition unit 120 may deposit one of the first intermediate layer, the second intermediate layer, and the third intermediate layer on the display substrate D, the second deposition unit 130 may deposit another one of the first intermediate layer, the second intermediate layer, and the third intermediate layer on the display substrate D, and the third deposition unit 140 may deposit the other of the first intermediate layer, the second intermediate layer, and the third intermediate layer on the display substrate D. However, hereinafter, for convenience of description, one or more embodiments where the first deposition unit 120 deposits the first intermediate layer on the display substrate D, the second deposition unit 130 deposits the second intermediate layer on the display substrate D, and the third deposition unit 140 deposits the third intermediate layer on the display substrate D will be described in more detail. Furthermore, one or more embodiments where the first intermediate layer, the second intermediate layer, and the third intermediate layer have the same shape and arrangement as the first sub-pixel, the second sub-pixel, and the third sub-pixel described with reference to FIGS. 1-3 above will be described in more detail.

In the loading unit 110, the display substrate D may be inserted from the outside and temporarily stored. In one or more embodiments, the loading unit 110 may store a plurality of display substrates D or one display substrate D. The loading unit 110 may receive the display substrate D from the outside through a robot arm or a movable shuttle arranged therein and may supply the display substrate D to the first deposition unit 120. Hereinafter, for convenience of description, one or more embodiments where the loading unit 110 supports the display substrate D through the robot arm therein and the display substrate D supplied from the robot arm is mounted on a shuttle and supplied to the first deposition unit 120 from the loading unit 110 will be described in more detail.

The first deposition unit 120 may deposit the first intermediate layer on the display substrate D. In one or more embodiments, the first deposition unit 120 may refer to one deposition unit or a plurality of deposition units. In one or more embodiments, when one first deposition unit 120 is provided, the first deposition unit 120 may form at least one layer of the first intermediate layer. The first deposition unit 120 may include at least one first deposition source 122 to form one layer of the first intermediate layer on the display substrate D. In one or more embodiments, when a plurality of first deposition sources 122 are provided so that the first deposition unit 120 forms a plurality of layers of the first intermediate layer, each of the first deposition sources 122 may be replaceable (e.g., replaceable with another first deposition source in response to exhausting the deposition material of each of the first deposition sources 122). In one or more embodiments, the first deposition sources 122 may store different deposition materials. In another embodiment, when a plurality of first deposition units 120 are provided, the first deposition units 120 may deposit the plurality of layers of the first intermediate layer on the display substrate D, respectively. In other words, each of the first deposition units 120 of the plurality of first deposition units 120 may deposit a corresponding layer of the plurality of layers of the first intermediate layer on the display substrate D. In one or more embodiments, the each of the first deposition units 120 may deposit different deposition materials on the display substrate D. However, hereinafter, for convenience of description, one or more embodiments where only one first deposition source 122 is provided and the first deposition source 122 forms only an organic emission layer of the first intermediate layer will be described in more detail.

The first deposition unit 120 may include a first chamber 121, the first deposition source 122, a first mask assembly 123, a first substrate supporting portion 124, a first mask supporting portion 125, a first magnetic force generating portion 126, and a first pressure regulating portion 127.

A space may be formed in the first chamber 121, and one side of the first chamber 121 may be opened to allow the display substrate D to be withdrawn from the first chamber 121 or received by the first chamber 121. In one or more embodiments, the shielding unit 160 including a gate valve or the like is arranged in the opened portion of the first chamber 121 and may be selectively opened and closed. In one or more embodiments, two sides (e.g., two opposing sides) of the first chamber 121 may be selectively opened and closed to allow the display substrate D to be withdrawn from the first chamber 121 or received by the first chamber 121.

The first deposition source 122 may contain a first deposition material forming at least one layer of the first intermediate layer. The first deposition source 122 may vaporize or sublimate the first deposition material by applying energy (e.g., thermal energy, light energy, vibration energy, etc.).

The first deposition source 122 as described above may be replaceable. The first deposition source 122 may be replaced with a new first deposition source 122 when the first deposition material contained in the first deposition source 122 is exhausted.

The first mask assembly 123 may include a first mask frame 123-1, a first mask sheet 123-2, and a first support frame 123-3.

The first mask frame 123-1 may have an opening at the center thereof. In one or more embodiments, the first mask frame 123-1 may be formed in a frame shape (e.g., a window frame shape). In one or more embodiments, the first mask frame 123-1 may have an opening at the center thereof, and a separate frame dividing the opening into a lattice form may be arranged therein. Hereinafter, for convenience of description, one or more embodiments where the first mask frame 123-1 has an opening at the center thereof will be described in more detail.

The first mask sheet 123-2 is arranged on one side of the first mask frame 123-1 under tension in at least one of the first direction (e.g., an X-axis direction) or the second direction (e.g., a Y-axis direction) and may be fixed or attached to the first mask frame 123-1 through welding or the like. The first mask frame 123-1 may be formed with a groove to accommodate the first mask sheet 123-2. The first mask sheet 123-2 may be formed in a rectangular shape and may be arranged at one side of the first mask frame 123-1. In one or more embodiments, the first mask sheet 123-2 may be formed in a slit shape.

The first mask sheet 123-2 may be a plurality of first mask sheets 123-2. The plurality of first mask sheets 123-2 may be arranged in a line to be adjacent to each other in the first direction or the second direction. In one or more embodiments, a long side of the first mask sheet 123-2 may be arranged to be parallel to a long side or a short side of the first mask frame 123-1. Hereinafter, for convenience of description, one or more embodiments where a long side of the first mask sheet 123-2 is arranged in the X-axis direction of FIG. 6 will be described in more detail.

The first mask sheet 123-2 may have a plurality of first openings 123-4. The plurality of first openings 123-4 may be arranged to be spaced apart from each other in the first direction and the second direction. In one or more embodiments, each of the first openings 123-4 may be rhombic with a vertex arranged in a tensile direction (i.e., an X-axis direction of FIG. 6) of the first mask sheet 123-2. In one or more embodiments, each of the first openings 123-4 may be in the form of a square having an angle of 90 degrees formed by two sides adjacent to each vertex. In one or more embodiments, centers of some of the plurality of first openings 123-4 may be arranged on a line in one of the tensile direction of the first mask sheet 123-2 and a direction (e.g., the Y-axis direction of FIG. 7) perpendicular or normal to the tensile direction of the first mask sheet 123-2. In one or more embodiments, centers of the other ones of the plurality of first openings 123-4 may be arranged in a serpentine shape in one of the tensile direction of the first mask sheet 123-2 and a direction perpendicular or normal to the tensile direction of the first mask sheet 123-2. In one or more embodiments, the plurality of first openings 123-4 may be arranged to correspond to the arrangement of the first sub-pixels described with reference to FIGS. 1-3. In the case where each of the plurality of first openings 123-4 is formed as described above, even if the first mask sheet 123-2 is under tension, a tensile shape of the first mask sheet 123-2 may be predicted to some extent. In other words, in one or more embodiments, the arrangement and shape of the plurality of first openings 123-4 of the first mask sheet 123-2 cause the shape of the first mask sheet 123-2 under tension to be more predictable (i.e., maintains the shape within a predictable range).

The first support frame 123-3 may be arranged in the first mask frame 123-1 to support the first mask sheet 123-2 as well as the first mask frame 123-1. The first support frame 123-3 may be arranged in the first mask frame 123-1 in a lattice shape to define a display area of one display device. That is, the first support frame 123-3 may define a plurality of display areas by dividing a central opening of the first mask frame 123-1 into a plurality of areas.

The first substrate supporting portion 124 may support the display substrate D. The first substrate supporting portion 124 may support the display substrate D by placing the display substrate D thereon or by coupling or attaching one surface of the display substrate D. For example, the first substrate supporting portion 124 may include a frame, a bar, or the like that is fixed or attached within the first chamber 121. In another embodiment, the first substrate supporting portion 124 may include a clamp for holding the display substrate D. In another embodiment, the first substrate supporting portion 124 may include an adhesive chuck or an electrostatic chuck. In one or more embodiments, the first substrate supporting portion 124 may be formed integrally with the first magnetic force generating portion 126. In another embodiment, the first substrate supporting portion 124 may also include a shuttle for transferring the display substrate D from the loading unit 110. However, hereinafter, for convenience of description, one or more embodiments where the first substrate supporting portion 124 includes a shuttle will be described in more detail.

The first mask supporting portion 125 may support the first mask assembly 123. Because the first mask supporting portion 125 may be the same as or similar to the first substrate supporting portion 124 described above, detailed descriptions thereof will not be repeated. Hereinafter, one or more embodiments where the first mask supporting portion 125 includes a frame fixed or attached within the first chamber 121 and the first mask assembly 123 is placed and supported on the frame will be described in more detail.

The first magnetic force generating portion 126 may be arranged in the first chamber 121 to bring the first mask frame 123-1 into close contact with the display substrate D. Here, the first magnetic force generating portion 126 may include an electromagnet.

The first pressure regulating portion 127 may be connected to the first chamber 121 to adjust pressure inside the first chamber 121. The first pressure regulating portion 127 may include a pipe connected to the first chamber 121 and a pump arranged in the pipe.

The second deposition unit 130 may deposit a second deposition material on the display substrate D on which the first intermediate layer is formed to form the second intermediate layer. The second deposition unit 130 may be similar to the first deposition unit 120 described above. The second deposition unit 130 may include a second mask sheet 133-2. The second mask sheet 133-2 may be similar to the first mask sheet 123-2. In one or more embodiments, the second mask sheet 133-2 may include a plurality of second openings 133-4. The plurality of second openings 133-4 may be spaced apart from each other. Some of the plurality of second openings 133-4 may be tilted in one direction with respect to a tensile direction (e.g., the X-axis direction in FIG. 8) of the second mask sheet 133-2. The other ones of the plurality of second openings 133-4 may be tilted in a direction different from the direction of the some of the plurality of second openings 133-4 with respect to a tensile direction of the second mask sheet 133-2. For example, the plurality of second openings 133-4 may be tilted to have an angle different from 0 degrees with respect to the tensile direction of the second mask sheet 133-2. In one or more embodiments, the plurality of second openings 133-4 may be arranged to form an angle of 45 degrees or about 45 degrees with respect to the tensile direction of the second mask sheet 133-2.

In one or more embodiments, centers of the second openings 133-4 may form a straight line in one direction. For example, centers of the some of the plurality of second openings 133-4 may form a straight line, and centers of the other ones of the plurality of second openings 133-4 may not form a straight line. For example, among the plurality of second openings 133-4 described above, centers of second openings 133-4 in a line which are arranged in one of the tensile direction of the second mask sheet 133-2 and a direction perpendicular or normal to the extension direction of the second mask sheet 133-2 may form a straight line. On the other hand, among the plurality of second openings 133-4, centers of second openings 133-4 arranged in the other of the tensile direction of the second mask sheet 133-2 and the direction perpendicular or normal to the tensile direction of the second mask sheet 133-2 may be arranged in a serpentine shape (or a zigzag shape). However, hereinafter, for convenience of description, one or more embodiments where centers of the some of the plurality of second openings 133-4 form a straight line and centers of the other ones of the plurality of second openings 133-4 do not form a straight line (e.g., form a zigzag shape) will be described in more detail. In one or more embodiments, the plurality of second openings 133-4 may be rectangular.

The second mask sheet 133-2 may be fixed or attached to a second mask frame in a state where a tensile force is applied to the second mask sheet 133-2, as described above. In this case, when the plurality of second openings 133-4 are all tilted in the same direction with respect to a tensile direction of the second mask sheet 133-2, deformation of the second mask sheet 133-2 may exceed a predictable range because degrees of deformation between the right and left or the front and back of the second mask sheet 133-2 are different from each other. In particular, in the above case, one portion of the second mask sheet 133-2 is largely deformed and the other portion of the second mask sheet 133-2 is not deformed or slightly deformed so that the shape of a second opening 133-4 may be distorted or the shape of the some of the plurality of second openings 133-4 and the shape of the other ones of the plurality of second openings 133-4 may be different from each other. Furthermore, in the above case, the centers of some of the plurality of second openings 133-4 may not be on a line.

However, as described above, the some of the plurality of second openings 133-4 and the other ones of the plurality of second openings 133-4 are formed on the second mask sheet 133-2 by being tilted in different directions with respect to the tensile direction of the second mask sheet 133-2. Therefore, the degree of deformation of the second mask sheet 133-2 during tensioning of the second mask sheet 133-2 may be uniformly maintained throughout the entire second mask sheet 133-2. Accordingly, it is possible to induce uniform deformation throughout the second mask sheet 133-2 by tilting second openings 133-4 adjacent to each other in different directions with respect to the tensile direction of the second mask sheet 133-2. In one or more embodiments, each of the plurality of second openings 133-4 may be arranged to form an angle of 45 degrees or about 45 degrees with respect to the tensile direction of the second mask sheet 133-2 and be tilted in a different direction from another one of the plurality of second openings 133-4 with respect to the tensile direction of the second mask sheet 133-2.

The third deposition unit 140 may deposit a third deposition material on the display substrate D on which the first intermediate layer and the second intermediate layer are formed to form the third intermediate layer. Here, the first intermediate layer, the second intermediate layer, and the third intermediate layer may be arranged so as not to overlap each other on a plane. The third deposition unit 140 may be similar to the first deposition unit 120. The third deposition unit 140 may include a third mask sheet 143-2 including a plurality of third openings 143-4. In one or more embodiments, the third mask sheet 143-2 may be similar to the second mask sheet 133-2 and the third openings 143-4 may be arranged similar to the second openings 133-4. However, when the second mask sheet 133-2 and the third mask sheet 143-2 are arranged to be stacked on each other, the second mask sheet 133-2 and the third mask sheet 143-2 may be manufactured such that the second openings 133-4 and the third openings 143-4 do not overlap each other.

The unloading unit 150 temporarily stores the display substrate D on which the first intermediate layer, the second intermediate layer, and the third intermediate layer are respectively formed, and may unload the display substrate D to the outside or transfer the display substrate D to another device. The unloading unit 150 may include a robot arm or the like for transferring the display substrate D therein.

As described above, the display substrate D, on which the first intermediate layer, the second intermediate layer, and the third intermediate layer are respectively formed, may be manufactured as the display device by forming the opposite electrode on the first intermediate layer, the second intermediate layer, and the third intermediate layer, and by forming the thin-film encapsulation layer.

Meanwhile, referring to the operation of the display device manufacturing apparatus 100, the display device manufacturing apparatus 100 may manufacture the first sub-pixel, the second sub-pixel, and the third sub-pixel in various suitable orders as described above. However, hereinafter, for convenience of description, one or more embodiments where the display device manufacturing apparatus 100 sequentially manufactures the first sub-pixel, the second sub-pixel, and the third sub-pixel shown in FIGS. 1-3 will be described in more detail.

After the display substrate D is transferred to the loading unit 110, the loading unit 110 may transfer the display substrate D to the first deposition unit 120.

The first deposition unit 120 may supply the first deposition material to the first deposition source 122 to form the first intermediate layer on the display substrate D. The first deposition material may be deposited on the display substrate D through the first openings 123-4. In one or more embodiments, the first intermediate layer may have a square shape that is tilted with respect to the tensile direction of the first mask sheet 123-2.

After the above process is completed or in response to the above process, the display substrate D is transferred from the first deposition unit 120 to the second deposition unit 130 and then the second deposition material may be deposited on the display substrate D in the second deposition unit 130. The second deposition unit 130 may form a pair of adjacent second intermediate layers which are tilted in different directions with respect to the tensile direction of the second mask sheet 133-2 on the display substrate D.

Thereafter, the display substrate D may be transferred from the second deposition unit 130 to the third deposition unit 140. The third deposition unit 140 may supply the third deposition material to the display substrate D and the third deposition material that has passed through the third openings 143-4 may be deposited on the display substrate D. The third deposition unit 140 may form a pair of adjacent third intermediate layers which are tilted in different directions with respect to the tensile direction of the third mask sheet 143-2 on the display substrate D.

The display substrate D on which the first intermediate layer, the second intermediate layer, and the third intermediate layer are formed may be taken out (or unloaded) through the unloading unit 150 or supplied to another device for the next operation. Thereafter, the opposite electrode and the thin-film encapsulation layer may be formed on the display substrate D to complete the manufacture of the display device.

Therefore, according to the display device manufacturing apparatus 100 and a method (hereinafter, referred to as a display device manufacturing method) of manufacturing a display device, it is possible to manufacture the display device having an accurate deposition pattern.

Furthermore, according to the display device manufacturing apparatus 100 and the display device manufacturing method, it is possible to reduce an error between a design pattern and an actual deposition pattern that may occur during manufacturing.

Figure 10:
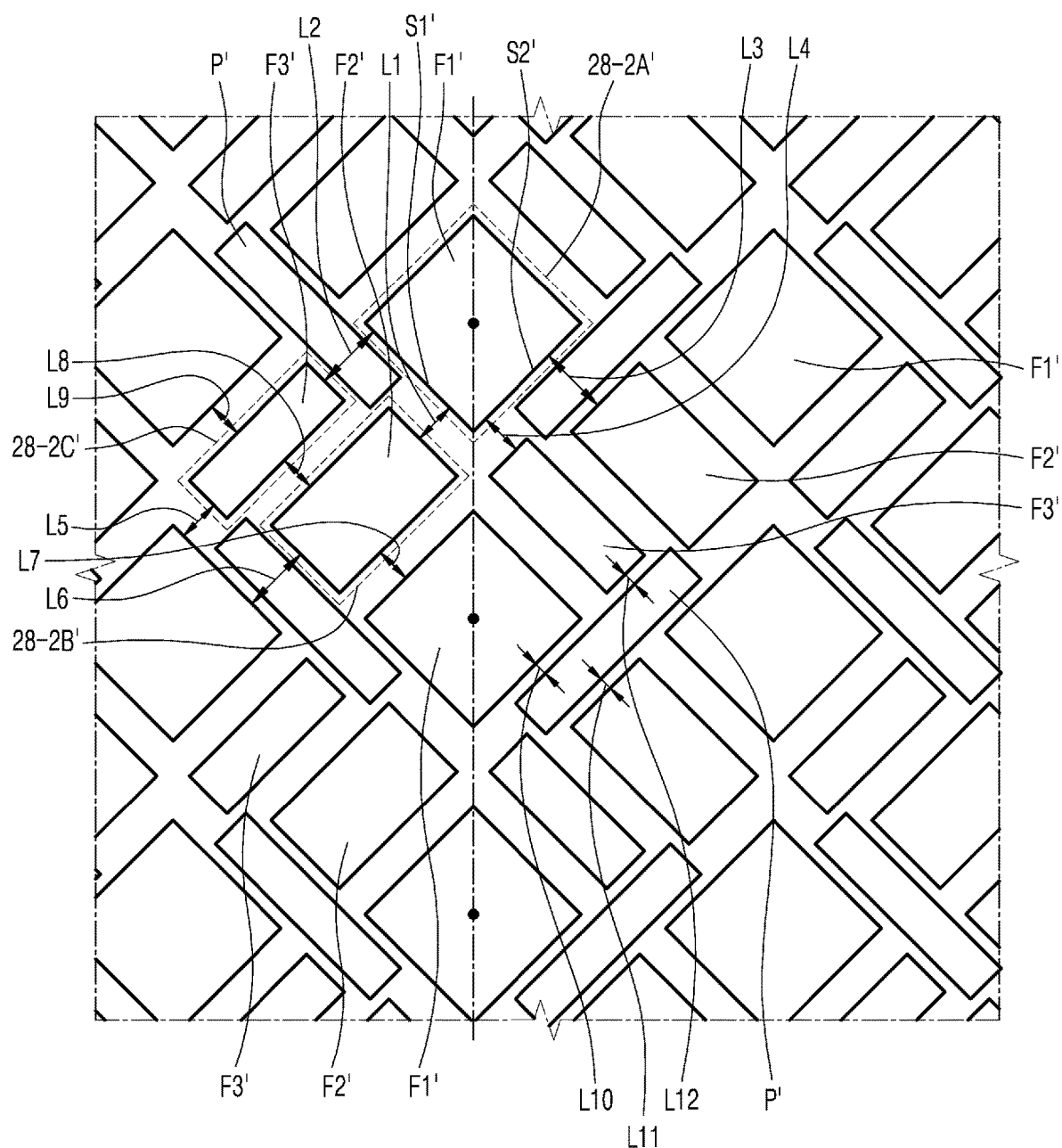
FIG. 10 is a plan view illustrating a first sub-pixel, a second sub-pixel, and a third sub-pixel of a display device according to another embodiment.
Figure 11:
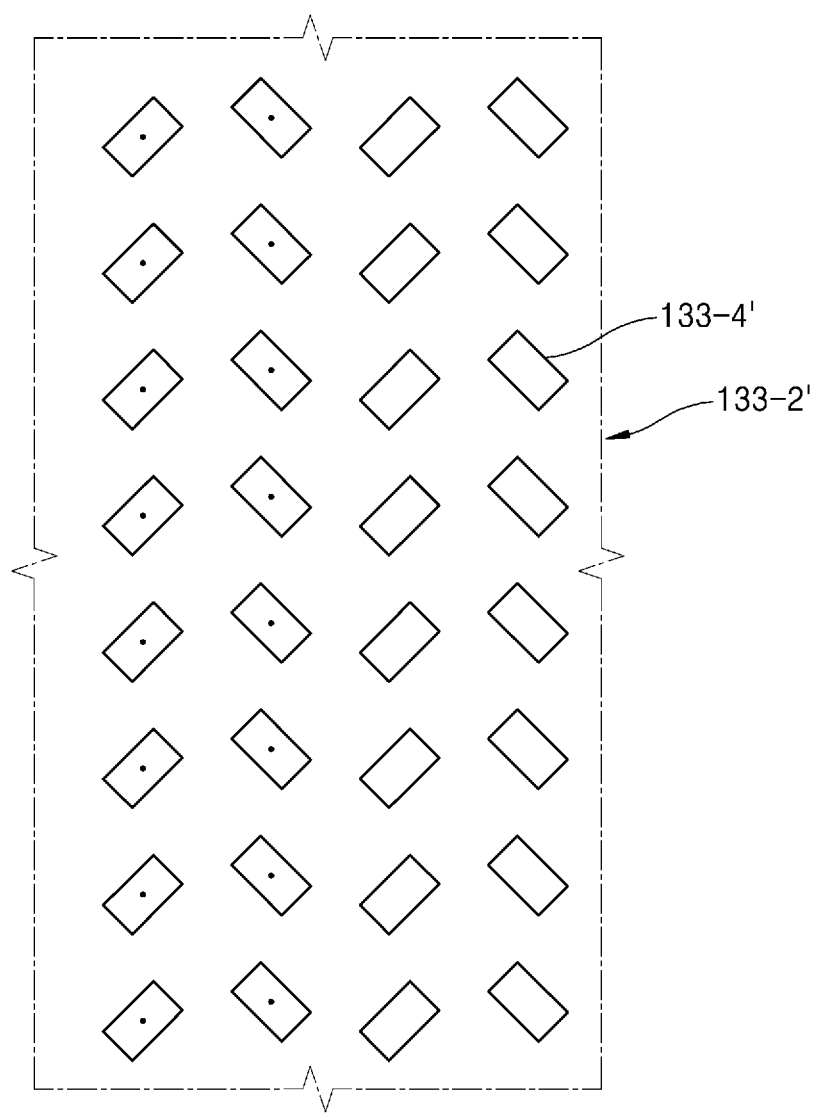
FIG. 11 is a plan view of a portion of a second mask sheet for depositing a second intermediate layer shown in FIG. 10.
Figure 12:
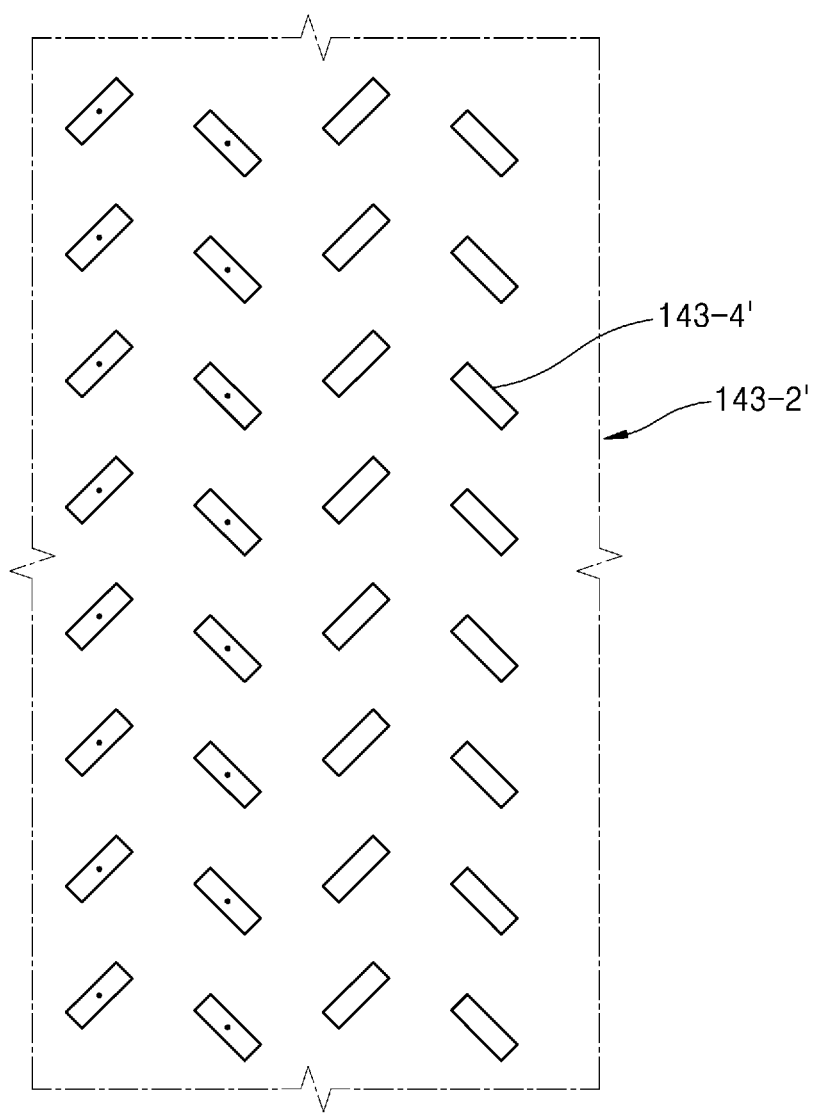
FIG. 12 is a plan view of a portion of a third mask sheet for depositing a third intermediate layer shown in FIG. 10.

FIG. 10 is a plan view illustrating a first sub-pixel, a second sub-pixel, and a third sub-pixel of a display device according to another embodiment. FIG. 11 is a plan view of a portion of a second mask sheet for depositing a second intermediate layer shown in FIG. 10. FIG. 12 is a plan view of a portion of a third mask sheet for depositing a third intermediate layer shown in FIG. 10.

Referring to FIGS. 10 and 12, a display device may include a display area and a non-display area defined on a substrate, the non-display area being around the display area. A plurality of sub-pixels including a first sub-pixel F1', a second sub-pixel F2', and a third sub-pixel F3' may be arranged in the display area, and a power line may be arranged in the non-display area. In one or more embodiments, a pad portion may be arranged in the non-display area. The display device may include a display substrate, an intermediate layer arranged in the display area, an opposite electrode, and a thin-film encapsulation layer.

The first sub-pixel F1', the second sub-pixel F2', and the third sub-pixel F3' may emit light of different colors. For example, one of the first sub-pixel F1', the second sub-pixel F2', and the third sub-pixel F3' emits blue light, another one of the first sub-pixel F1', the second sub-pixel F2', and the third sub-pixel F3' emits red light, and the other of the first sub-pixel F1', the second sub-pixel F2', and the third sub-pixel F3' emits green light.

One of the first sub-pixel the second sub-pixel F2', and the third sub-pixel F3' may be square, and the other two may be rectangular (e.g., as illustrated in FIG. 10). As illustrated in FIG. 10, the first sub-pixel F1' may include a first side S1' and a second side S2'.

Hereinafter, for convenience of description, one or more embodiments where the first sub-pixel F1' is square and emits red light, the second sub-pixel F2' is rectangular and emits green light, and the third sub-pixel F3' is rectangular and emits blue light will be described in more detail.

The first sub-pixel F1' as described above may include a first intermediate layer 28-2A'. In one or more embodiments, the first intermediate layer 28-2A' may correspond to the shape and position of the first sub-pixel F1'. The planar area of the first intermediate layer 28-2A' may be equal to or greater than the planar area of the first sub-pixel F1'. The first sub-pixel F1' may be arranged inside the first intermediate layer 28-2A'.

The second sub-pixel F2' may include a second intermediate layer 28-2B'. In one or more embodiments, the second intermediate layer 28-2B' may correspond to the shape and position of the second sub-pixel F2'. The planar area of the second intermediate layer 28-2B' may be equal to or greater than the planar area of the second sub-pixel F2'. The second sub-pixel F2' may be arranged inside the second intermediate layer 28-2B'.

The third sub-pixel F3' may include a third intermediate layer 28-2C'. In one or more embodiments, the third intermediate layer 28-2C' may correspond to the shape and position of the third sub-pixel F3'. The planar area of the third intermediate layer 28-2C' may be equal to or greater than the planar area of the third sub-pixel F3'. The third sub-pixel F3' may be arranged inside the third intermediate layer 28-2C'.

In one or more embodiments, the planar area of the second sub-pixel F2' and the planar area of the third sub-pixel F3' may suitably vary.

In one or more embodiments, the planar areas of some of a plurality of second sub-pixels F2' may be different from the planar areas of the other ones of the plurality of second sub-pixels F2', and the planar areas of some of a plurality of third pixels F3' may be different from the planar areas of the other ones of the plurality of third sub-pixels F3'.

In another embodiment, the planar areas of the plurality of second sub-pixels F2' may be the same or substantially the same and the planar areas of the plurality of third sub-pixels F3' may be the same or substantially the same. In one or more embodiments, the planar area of each of the second sub-pixels F2' and the planar area of each of the third sub-pixels F3' may be different from each other. For example, one of the planar area of the second sub-pixel F2' and the planar area of the third sub-pixel F3' may be less than the other of the planar area of the second sub-pixel F2' and the planar area of the third sub-pixel F3'. In one or more embodiments, the planar area of the second sub-pixel F2' may be less than the planar area of the third sub-pixel F3'. In another embodiment, the planar area of the third sub-pixel F3' may be less than the planar area of the second sub-pixel F2'. Therefore, it is possible to adjust an aperture ratio of light emitted from each sub-pixel.

In one or more embodiments, the long side of the second sub-pixel F2' and the long side of the third sub-pixel F3' may have the same length or substantially the same length. However, the length of the short side of the second sub-pixel F2' and the length of the short side of the third sub-pixel F3' may be different from each other.

As described above, the adjustment of the area of at least one of the first sub-pixel F1', the second sub-pixel F2', or the third sub-pixel F3' may be achieved by adjusting an area where a pixel-defining layer exposes a pixel electrode, as described above. In one or more embodiments, the areas and shapes of the first intermediate layer 28-2A', the second intermediate layer 28-2B', and the third intermediate layer 28-2C' formed by being respectively deposited on the first sub-pixel F1', the second sub-pixel F2', and the third sub-pixel F3' may correspond to the areas and shapes of the first sub-pixel F1', the second sub-pixel F2', and the third sub-pixel F3', respectively, to prevent or substantially prevent the sub-pixels from overlapping each other.

A second mask sheet 133-2' and a third mask sheet 143-2' may be used to form the second intermediate layer 28-2B' and the third intermediate layer 28-2C' as described above. The second mask sheet 133-2' may include a plurality of second openings 133-4', and the third mask sheet 143-2' may include third openings 143-4'. In one or more embodiments, the area of each of the second openings 133-4 'and the area of each of the third openings 143-4' may be different from each other. In one or more embodiments, the area of each of the second openings 133-4' and the area of each of the third openings 143-4' may correspond the area of the second intermediate layer 28-2B' and the area of the third intermediate layer 28-2C', respectively. The relationship between each sub-pixel, each intermediate layer, and each opening as described above may be applicable to all embodiments of the present disclosure.

Two second openings 133-4' adjacent to each other among the second openings 133-4' may be arranged in a state of being tilted in the opposite directions with respect to a tensile direction of the second mask sheet 133-2'. Furthermore, two third openings 143-4' adjacent to each other among the third openings 143-4' may be arranged in a state of being tilted in the opposite directions with respect to a tensile direction of the third mask sheet 143-2'.

As described above, even when the second mask sheet 133-2' and the third mask sheet 143-2' are under tension, shapes of the second openings 133-4' and the third openings 143-4' are maintained substantially similar to the initial shapes and may be moved within a predictable range to some extent when positions of the second openings 133-4' and the third opening 143-4' are variable in the initial position. Therefore, it is somewhat possible to correct a pattern when depositing a second deposition material and a third deposition material on the display substrate in the future.

A spacer P' may be arranged between some sub-pixels of the plurality of sub-pixels. In one or more embodiments, the spacer P' is the same as or similar to that described with reference to FIGS. 1-3, and thus, a detailed description thereof will not be repeated. In one or more embodiments, the arrangement of each sub-pixel, a distance from the edge of a sub-pixel to the edge of another sub-pixel, a distance from the edge of the spacer P' to the edge of each sub-pixel, etc. are the same as those described above with reference to FIGS. 1-3, and thus, detailed descriptions thereof will not be repeated.

The display device may be fixed or attached to a device or the like that can be operated by a user such as a vehicle. The display device may be fixed or attached to the device to form a certain angle different from 0 degrees between a user's viewing direction and the first direction or the second direction. For example, the display device may be arranged such that the user's viewing direction of the display device and the first direction or the second direction form an angle of 90 degrees.

In the above case, when a user looks at the display device, an inclined portion of a pixel-defining layer is not perpendicular or normal to the user's viewing direction. Accordingly, external light may be prevented or substantially prevented from being reflected through the inclined portion of the pixel-defining layer and incident on the user's eyes. In other words, the inclined portion may prevent or substantially prevent external light being reflected into the user's eyes.

Further, the display device may implement (or provide) a precise image through each sub-pixel.

The display device may be manufactured through a manufacturing apparatus of the display device. The display device manufacturing apparatus may be formed similar to that shown in FIGS. 4 and 5. In one or more embodiments, a second deposition unit and a third deposition unit form the first intermediate layer 28-2A' by using the first mask assembly 123 shown in FIG. 6. The second intermediate layer 28-2B' and the third intermediate layer 28-2C' may be formed on the display substrate through deposition materials passing through the second opening 133-4' and the third opening 143-4', respectively, by using the second mask sheet 133-2' and the third mask sheet 143-2'.

According to the display device manufacturing apparatus and the display device manufacturing method, a display device having a precise deposition pattern may be manufactured by reducing the deformation of each mask sheet.

Furthermore, according to the display device manufacturing apparatus and the display device manufacturing method, it is possible to reduce an error between a design pattern and an actual deposition pattern that may occur during manufacturing.

Figure 13:
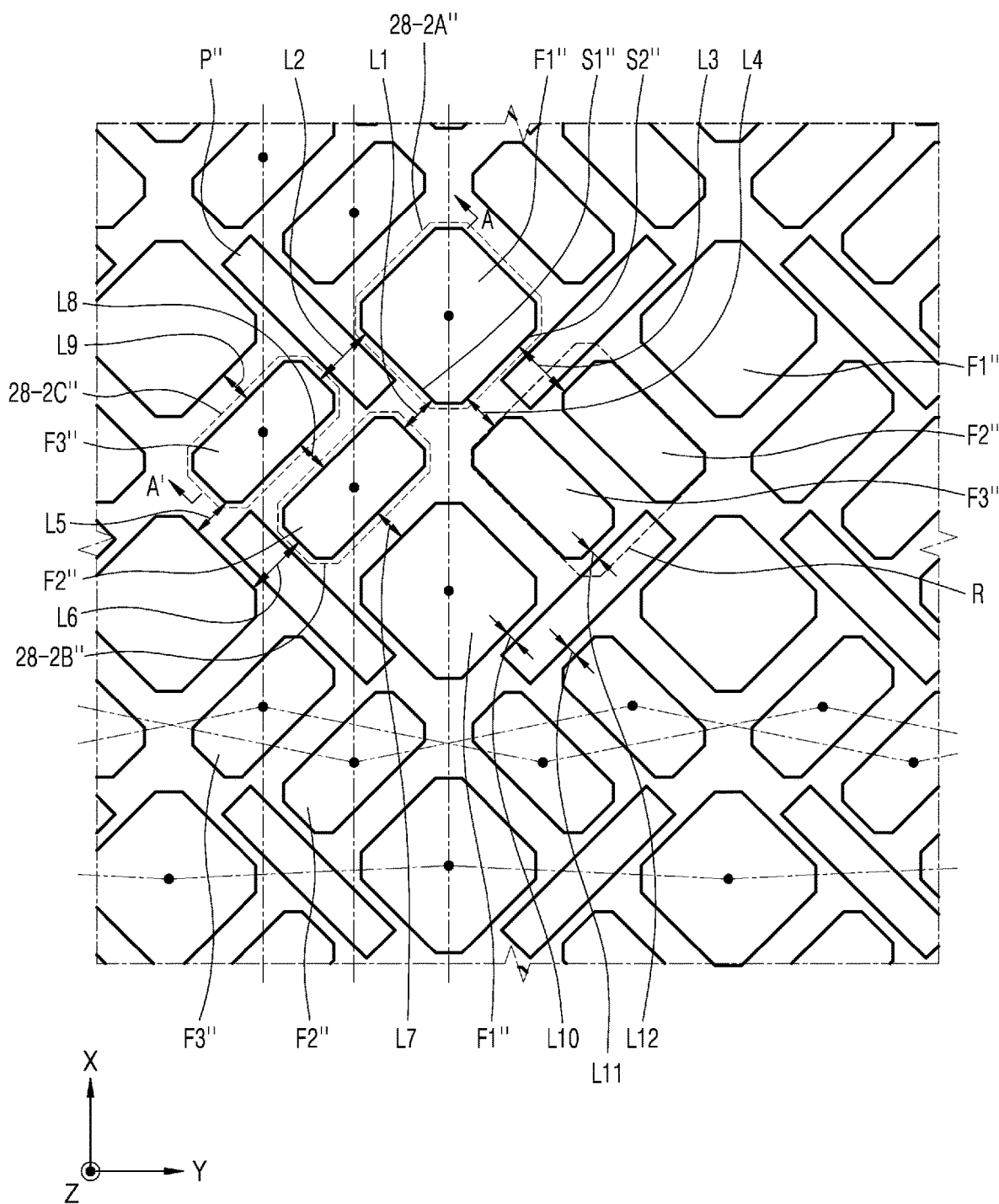
FIG. 13 is a plan view illustrating a first sub-pixel, a second sub-pixel, and a third sub-pixel of a display device according to another embodiment.
Figure 14:
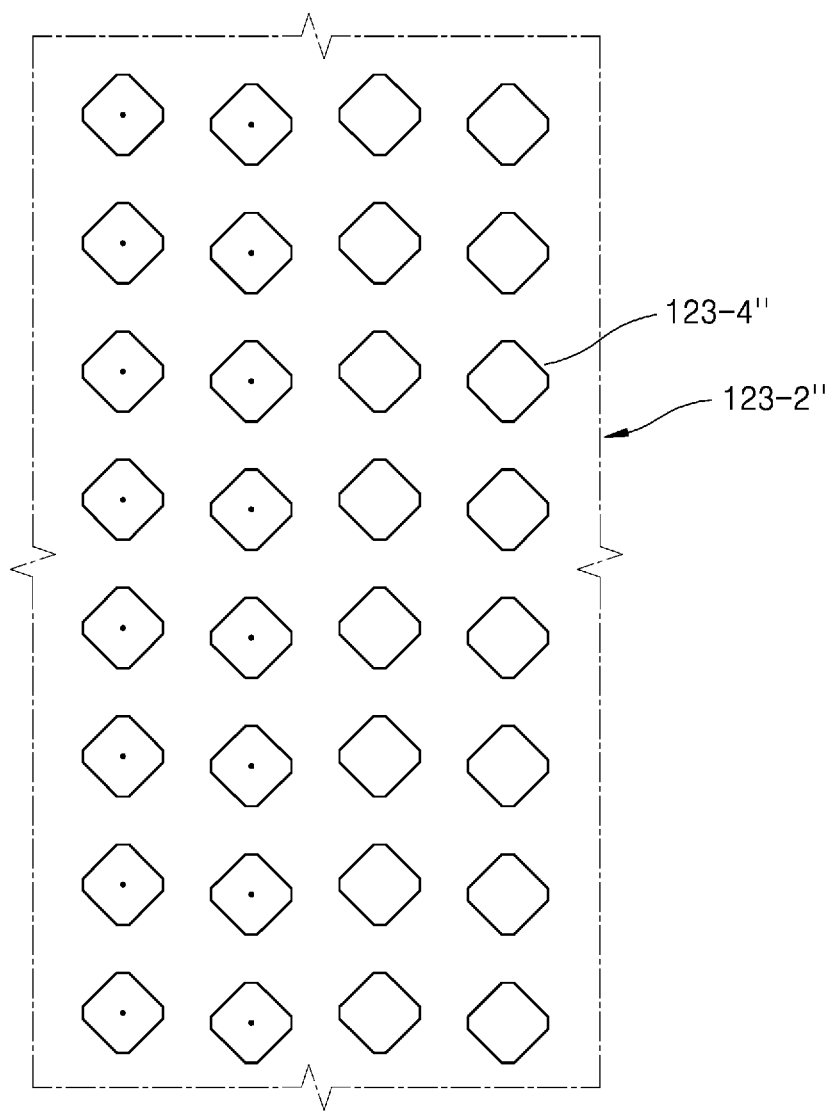
FIG. 14 is a plan view of a portion of a first mask sheet for depositing a first intermediate layer shown in FIG. 13.
Figure 15:
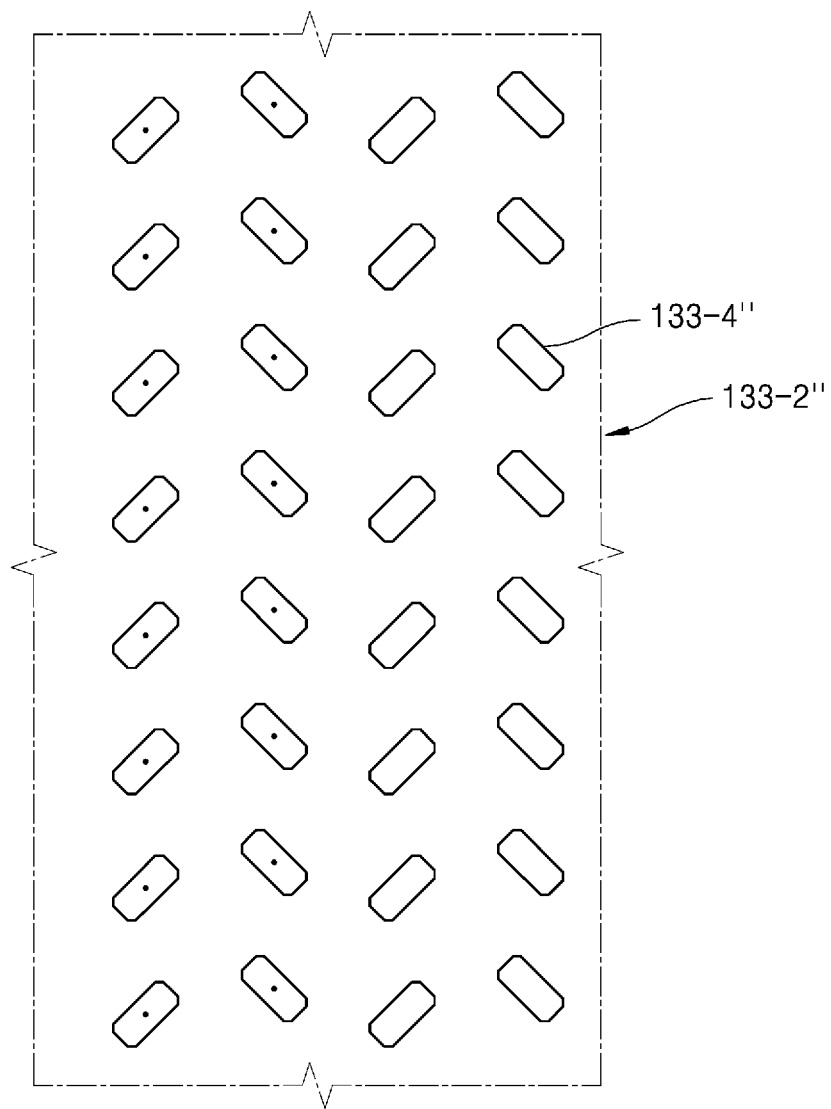
FIG. 15 is a plan view of a portion of a second mask sheet for depositing a second intermediate layer shown in FIG. 13.
Figure 16:
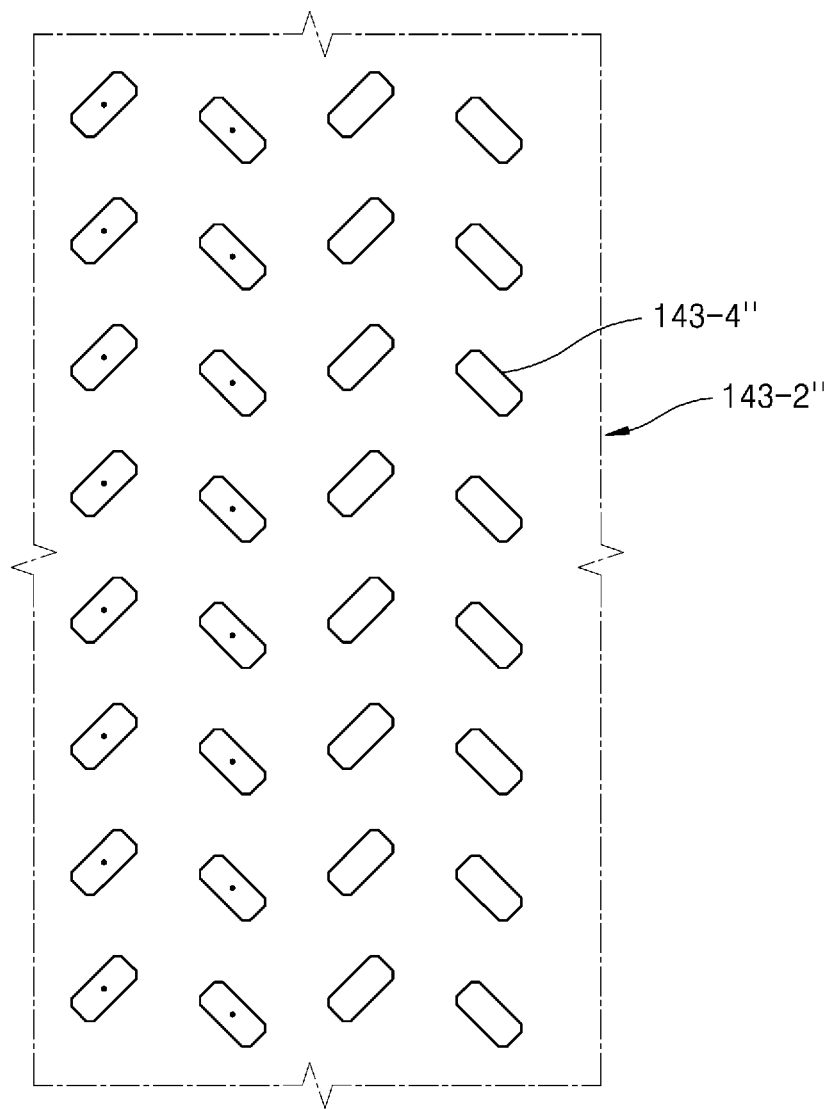
FIG. 16 is a plan view of a portion of a third mask sheet for depositing a third intermediate layer shown in FIG. 13.

FIG. 13 is a plan view illustrating a first sub-pixel, a second sub-pixel, and a third sub-pixel of a display device according to another embodiment. FIG. 14 is a plan view of a portion of a first mask sheet for depositing a first intermediate layer shown in FIG. 13. FIG. 15 is a plan view of a portion of a second mask sheet for depositing a second intermediate layer shown in FIG. 13. FIG. 16 is a plan view of a portion of a third mask sheet for depositing a third intermediate layer shown in FIG. 13.

Referring to FIGS. 13-16, a display device may include a display area and a non-display area defined on a substrate, the non-display area being around the display area. A plurality of sub-pixels including a first sub-pixel F1", a second sub-pixel F2", and a third sub-pixel F3" may be arranged in the display area, and a power line may be arranged in the non-display area. In one or more embodiments, a pad portion may be arranged in the non-display area. The display device may include a display substrate, an intermediate layer arranged in the display area, an opposite electrode, and a thin-film encapsulation layer. The display device is the same as or similar to that described above in FIG. 3, and thus, a detailed description thereof will not be repeated.

The first sub-pixel F1", the second sub-pixel F2", and the third sub-pixel F3" may emit light of different colors. For example, one of the first sub-pixel F1", the second sub-pixel F2", and the third sub-pixel F3" emits blue light, another one of the first sub-pixel F1", the second sub-pixel F2", and the third sub-pixel F3" emits red light, and the other of the first sub-pixel F1", the second sub-pixel F2", and the third sub-pixel F3" emits green light.

One of the first sub-pixel F1', the second sub-pixel F2', and the third sub-pixel F3" may be square, and the other two may be rectangular. As illustrated in FIG. 13, the first sub-pixel F1" may include a first side S1" and a second side S2".

Hereinafter, for convenience of description, one or more embodiments where the first sub-pixel F1" is square and emits red light, the second sub-pixel F2" is rectangular and emits green light, and the third sub-pixel F3" is rectangular and emits blue light will be described in more detail. In one or more embodiments, the first sub-pixel F1", the second sub-pixel F2", and the third sub-pixel F3" may be similar to those described with reference to FIGS. 1-3. However, corners of each of the sub-pixels may be chamfered. That is, corner portions of each of the sub-pixels may be rounded or inclined.

The first sub-pixel F1" as described above may be arranged inside a first intermediate layer 28-2A", and the first intermediate layer 28-2A" may correspond to the shape and position of the first sub-pixel F1". The planar area of the first intermediate layer 28-2A" may be equal to or greater than the planar area of the first sub-pixel F1".

In one or more embodiments, the second intermediate layer 28-2B" may correspond to the shape and position of the second sub-pixel F2". The second sub-pixel F2" may be arranged inside the second intermediate layer 28-2B".

In one or more embodiments, the third intermediate layer 28-2C" may correspond to the shape and position of the third sub-pixel F3". The third sub-pixel F3" may be arranged inside the third intermediate layer 28-2C".

A spacer P" may be arranged between each of the sub-pixels as described above. The spacer P" is the same as or similar to that described with reference to FIGS. 1-3, and thus, a detailed description thereof will not be repeated.

In order to manufacture the first sub-pixel F1", the second sub-pixel F2", and the third sub-pixel F3" as described above, the display substrate may be supplied to the display device manufacturing apparatus described with reference to FIGS. 4 and 5.

In one or more embodiments, a first deposition unit may supply a first deposition material to the display substrate to form a first intermediate layer 28-2A", a second deposition unit may supply a second deposition material to the display substrate to form a second intermediate layer 28-2B", and a third deposition unit may supply a third deposition material to the display substrate to form a third intermediate layer 28-2C".

In one or more embodiments, a first mask sheet 123-2" used in the first deposition unit may include a first opening 123-4" formed to correspond to a shape of the first sub-pixel F1". In one or more embodiments, the planar area of the first opening 123-4" may be equal to or greater than the planar area of a corresponding first sub-pixel F1". Furthermore, the planar area of the first openings 123-4" may be less than the planar area of the first intermediate layer 28-2A" formed by depositing the first deposition material having passed through the first opening 123-4" on the display substrate. A shape of the first opening 123-4", a shape of the first intermediate layer 28-2A", and a shape of the first sub-pixel F1", which correspond to each other, may be the same and be square.

A second opening 133-4″ of a second mask sheet 133-2″ used in the second deposition unit may be formed to correspond to a shape of the second sub-pixel F2″. The second opening 133-4″ may be arranged in the same manner as the arrangement of the second sub-pixel F2″. In one or more embodiments, the planar area of the second opening 133-4″ may be equal to or greater than the planar area of the second sub-pixel F2″, and may be less than the planar area of the second intermediate layer 28-2B″ formed by depositing the second deposition material on the display substrate.

A third opening 143-4″ of a third mask sheet 143-2″ used in the third deposition unit is also formed to correspond to the shape of the third sub-pixel F3″, and the planar area of the third opening 143-4″ may be equal to or greater than the planar area of the third sub-pixel F3″. Furthermore, the planar area of the third opening 143-4″ may be less than the planar area of the third intermediate layer 28-2C″.

In one or more embodiments, a relationship among the first sub-pixel F1″, the second sub-pixel F2″, and the third sub-pixel F3″ may be similar to those described with reference to FIGS. 1-3. A relationship among the first intermediate layer 28-2A″, the second intermediate layer 28-2B″, and the third intermediate layer 28-2C″ may be the same as the relationship among the first sub-pixel F1″, the second sub-pixel F2″, and the third sub-pixel F3″.

For example, centers of some of the plurality of second sub-pixels F2″ may be in a straight line in one direction, and centers of the other ones of the plurality of second sub-pixels F2″ may be arranged in a serpentine shape in another direction. Furthermore, centers of some of a plurality of third sub-pixels F3″ may be arranged in a straight line, and centers of the other ones of the plurality of third sub-pixels F3″ may be arranged in a serpentine shape in another direction. Centers of the plurality of first sub-pixels F1″ may be in a straight line in a direction different from the one direction.

In one or more embodiments, the second sub-pixel F2″ and the third sub-pixel F3″ facing the same first sub-pixel F1″ may be tilted in opposite directions with respect to a tensile direction of the second mask sheet 133-2″ and a tensile direction of the third mask sheet 143-2″. In one or more embodiments, the second sub-pixels F2″ adjacent to each other may form an angle of 45 degrees or about 45 degrees with respect to the tensile direction of the second mask sheet 133-2″ in opposite directions, respectively. Also, the second openings 133-4″ formed in the second mask sheet 133-2″ and adjacent to each other may form an angle of 45 degrees or about 45 degrees with respect to the tensile direction of the second mask sheet 133-2″. The third sub-pixels F3″ adjacent to each other may form an angle of 45 degrees or about 45 degrees with respect to the tensile direction of the third mask sheet 143-2″ in opposite directions, respectively. Also, the third openings 143-4″ formed in the third mask sheet 143-2″ and adjacent to each other may form an angle of 45 degrees or about 45 degrees with respect to the tensile direction of the third mask sheet 143-2″. The second intermediate layer 28-2B″ and the third intermediate layer 28-2C″ may be arranged on the display substrate at positions corresponding to the second opening 133-4″ and the third opening 143-4″, respectively.

The display device may be fixed or attached to a device such as a vehicle for moving a user. The display device may be fixed or attached to the device to form an angle different from 0 degrees between a user's viewing direction and the first direction or the second direction. For example, the display device may be arranged so that the user's viewing direction of the display device 20 and the first direction or the second direction form an angle of 90 degrees.

In the above case, when a user looks at the display device 20, an inclined portion of the pixel-defining layer is not perpendicular or normal to the user's viewing direction. Accordingly, external light may be prevented or substantially prevented from being reflected through the inclined portion of the pixel-defining layer and incident on the user's eyes. In other words, the inclined portion may prevent or substantially prevent external light being reflected into the user's eyes.

Furthermore, the display device may implement (or provide) a precise image through each sub-pixel.

According to the display device manufacturing apparatus and the display device manufacturing method, it is possible to manufacture the display device having an accurate deposition pattern.

Furthermore, according to the display device manufacturing apparatus and the display device manufacturing method, it is possible to reduce an error between a design pattern and an actual deposition pattern that may occur during manufacturing.

Figure 17:
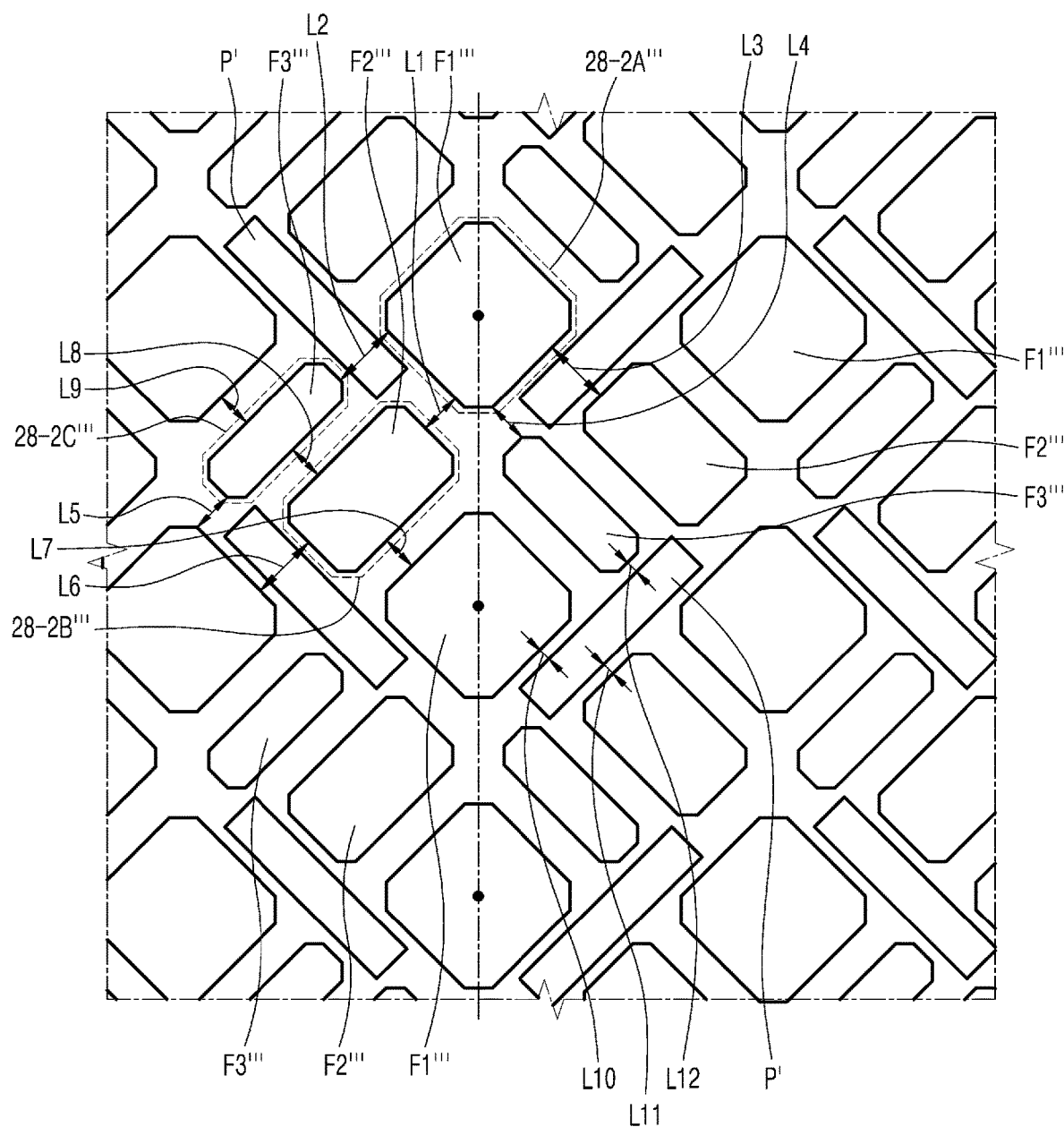
FIG. 17 is a plan view illustrating a first sub-pixel, a second sub-pixel, and a third sub-pixel of a display device according to another embodiment.
Figure 18:
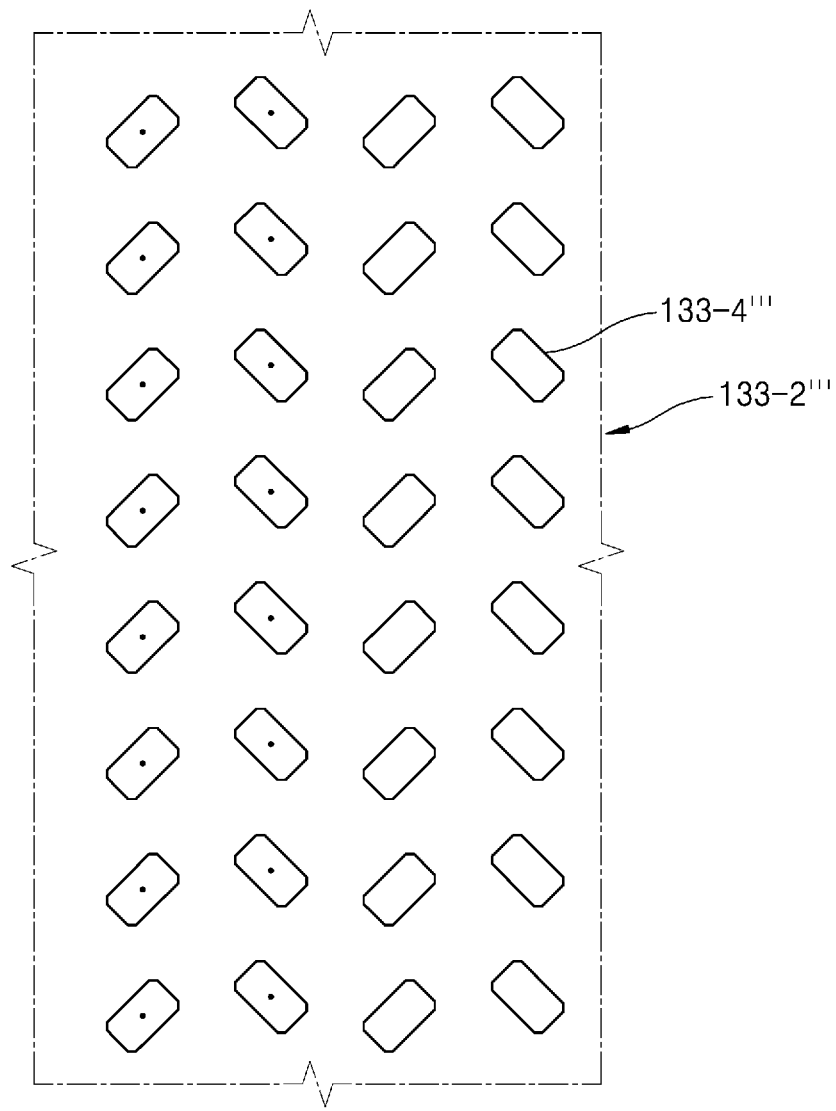
FIG. 18 is a plan view of a portion of a second mask sheet for depositing a second intermediate layer shown in FIG. 17.
Figure 19:
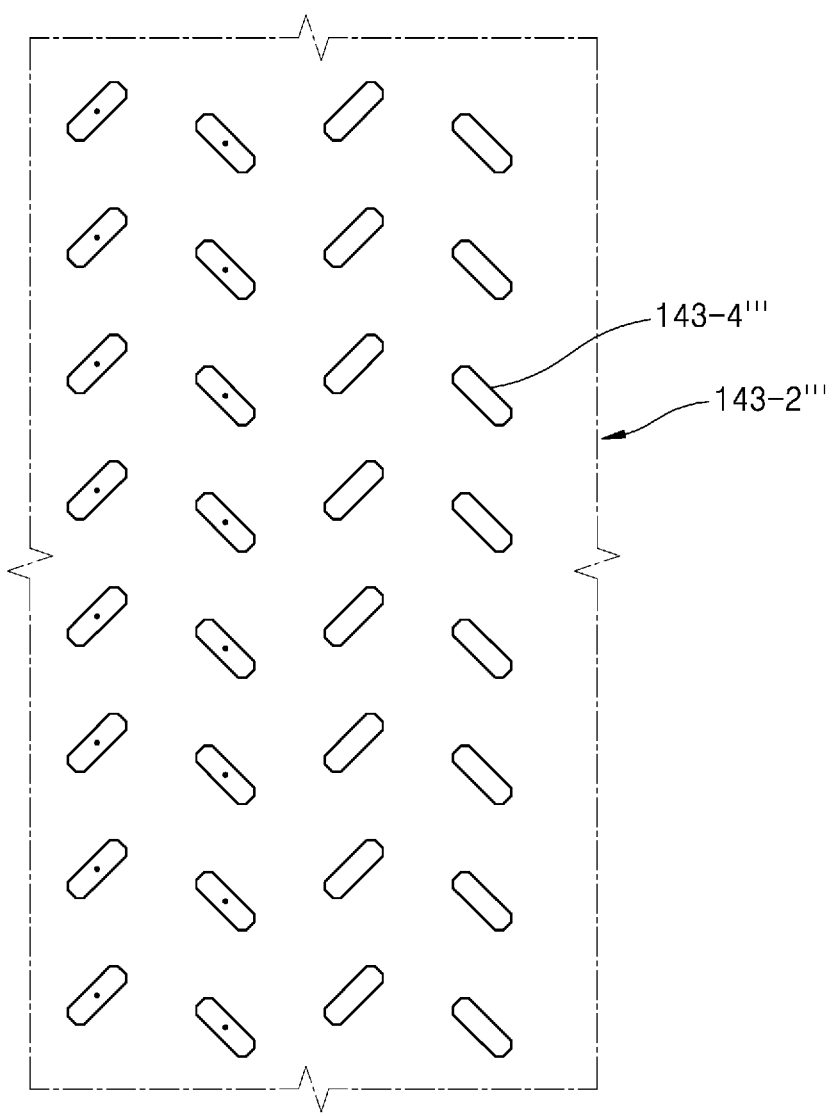
FIG. 19 is a plan view of a portion of a third mask sheet for depositing a third intermediate layer shown in FIG. 17.

FIG. 17 is a plan view illustrating a first sub-pixel, a second sub-pixel, and a third sub-pixel of a display device according to another embodiment. FIG. 18 is a plan view of a portion of a second mask sheet for depositing a second intermediate layer shown in FIG. 17. FIG. 19 is a plan view of a portion of a third mask sheet for depositing a third intermediate layer shown in FIG. 17.

Referring to FIGS. 17-19, a display device may include a display area and a non-display area defined on a substrate, the non-display area being around the display area. A plurality of sub-pixels including a first sub-pixel F1‴, a second sub-pixel F2‴, and a third sub-pixel F3‴ may be arranged in the display area, and a power line may be arranged in the non-display area. In one or more embodiments, a pad portion may be arranged in the non-display area. The display device may include a display substrate, an intermediate layer arranged in the display area, an opposite electrode, and a thin-film encapsulation layer.

The first sub-pixel F1‴, the second sub-pixel F2‴, and the third sub-pixel F3‴ may emit light of different colors. For example, one of the first sub-pixel F1‴, the second sub-pixel F2‴, and the third sub-pixel F3‴ emits blue light, another one of the first sub-pixel F1‴, the second sub-pixel F2‴, and the third sub-pixel F3‴ emits red light, and the other of the first sub-pixel F1‴, the second sub-pixel F2‴, and the third sub-pixel F3‴ emits green light.

One of the first sub-pixel F1‴, the second sub-pixel F2‴, and the third sub-pixel Fr may be square, and the other two may be rectangular.

Hereinafter, for convenience of description, one or more embodiments where the first sub-pixel F1‴ is square and emits red light, the second sub-pixel F2‴ is rectangular and emits green light, and the third sub-pixel F3‴ is rectangular and emits blue light will be described in more detail.

The first sub-pixel F1‴ as described above may include a first intermediate layer 28-2A‴, and the first intermediate layer 28-2A‴ may correspond to the shape and position of the first sub-pixel F1‴. The planar area of the first intermediate layer 28-2A‴ may be greater than the planar area of the first sub-pixel F1‴. The first sub-pixel F1‴ may be arranged inside the first intermediate layer 28-2A‴.

The second sub-pixel F2‴ may include a second intermediate layer 28-2B‴. In one or more embodiments, the second intermediate layer 28-2B‴ my correspond to the shape and position of the second sub-pixel F2‴. The planar area of the second intermediate layer 28-2B''' may be greater than the planar area of the second sub-pixel F2'''. The second sub-pixel F2''' may be arranged inside the second intermediate layer 28-2B'''.

The third sub-pixel Fr may include a third intermediate layer 28-2C'''. In one or more embodiments, the third intermediate layer 28-2C''' may correspond to the shape and position of the third sub-pixel Fr. The planar area of third intermediate layer 28-2C''' may be greater than the planar area of the third sub-pixel Fr. The third sub-pixel F3''' may be arranged inside the third intermediate layer 28-2C'''.

The first sub-pixel F1''', the second sub-pixel F2''', and the third sub-pixel Fr may be applied to the structures shown in FIGS. 1-3 in the same or similar manner, and may be arranged the same as or similar to those described with reference to FIGS. 1-3.

At least one of the first sub-pixel F1''', the second sub-pixel F2''', or the third sub-pixel F3''' may have a chamfered edge. For example, in one or more embodiments, one of a vertex of the first sub-pixel F1''', a vertex of the second sub-pixel F2''', and a vertex of the third sub-pixel F3''' may be chamfered, and the remaining two of them may not be chamfered. In another embodiment, two of the vertex of the first sub-pixel F1''', the vertex of the second sub-pixel F2''', and the vertex of the third sub-pixel F3''' may be chamfered, and the remaining one of them may not be chamfered. In another embodiment, all of the vertex of the first sub-pixel F1''', the vertex of the second sub-pixel F2''', and the vertex of the third sub-pixel F3''' may be chamfered. Hereinafter, for convenience of description, one or more embodiments where all of the vertex of the first sub-pixel F1''', the vertex of the second sub-pixel F2''', and the vertex of the third sub-pixel F3''' are chamfered will be described in more detail.

In order to form the vertex of the first sub-pixel F1''', the vertex of the second sub-pixel F2''', and the vertex of the third sub-pixel F3''' that are chamfered as described above, a vertex (or corner) of a first opening of a first mask sheet, a vertex (or corner) of a second opening 133-4''' of a second mask sheet 133-2''', and a vertex (or corner) of a third opening 143-4''' of a third mask sheet 143-2''' may be chamfered. In one or more embodiments, each of the first opening, the second opening 133-4''', and the third opening 143-4''' may be the same as or similar to an octagonal shape. In one or more embodiments, chamfered portions in the first opening, the second opening 133-4''', and the third opening 143-4''' may be rounded. The first opening may be formed as shown in FIG. 14, the second opening 133-4''' may be inclined as shown in FIG. 18, and the third opening 143-4''' may be inclined as shown in FIG. 19.

When the vertex of the first opening, the vertex of the second opening 133-4''', and the vertex of the third opening 143-4''' are chamfered as described above, stress may not be concentrated (i.e., stress may be reduced) on the vertex of the first opening, the vertex of the second opening 133-4''', and the vertex of the third opening 143-4''' when the first mask sheet, the second mask sheet 133-2''', and the third mask sheet 143-2''' are respectively under tension. Therefore, when the first mask sheet, the second mask sheet 133-2''', and the third mask sheet 143-2''' are respectively under tension, damage to the first mask sheet, the second mask sheet 133-2''', and the third mask sheet 143-2''' may be prevented or reduced. In one or more embodiments, because a first deposition material, a second deposition material, and a third deposition material are not deposited and do not clog at the vertex of the first opening, the vertex of the second opening 133-4''', and the vertex of the third opening 143-4''', the first intermediate layer 28-2A''', the second intermediate layer 28-2B''', and the third intermediate layer 28-2C''' having correct shapes may be formed. In other words, the first intermediate layer 28-2A''', the second intermediate layer 28-2B''', and the third intermediate layer 28-2C''' may be formed with greater accuracy.

The display device may be manufactured through a display device manufacturing apparatus of the same or similar type as the display device manufacturing apparatus shown in FIGS. 4 and 5 described above.

In one or more embodiments, a first deposition unit may supply a first deposition material to the display substrate to form the first intermediate layer 28-2A''', a second deposition unit may supply a second deposition material to the display substrate to form the second intermediate layer 28-2B''', and a third deposition unit may supply a third deposition material to the display substrate to form the third intermediate layer 28-2C'''.

In one or more embodiments, the first mask sheet used in the first deposition unit may include the first opening formed to correspond to the shape of the first sub-pixel F1'''. In one or more embodiments, the planar area of the first opening may be equal to or greater than the planar area of a corresponding first sub-pixel F1'''. Also, the planar area of the first openings may be equal to or greater than the planar area of the first intermediate layer 28-2A''' formed by depositing the first deposition material having passed through the first opening on the display substrate. A shape of the first opening, a shape of the first intermediate layer 28-2A''', and a shape of the first sub-pixel F1''', which correspond to each other, may be the same or substantially the same and be square.

A second opening 133-4''' of a second mask sheet 133-2''' used in the second deposition unit may be formed to correspond to the shape of the second sub-pixel F2'''. The second openings 133-4''' may be arranged in the same manner as the arrangement of the second sub-pixels F2'''. In one or more embodiments, the planar area of the second opening 133-4''' may be equal to or greater than the planar area of the second sub-pixel F2''', and may be equal to or greater than the planar area of the second intermediate layer 28-2B''' formed by depositing the second deposition material on the display substrate.

A third opening 143-4''' of a third mask sheet 143-2''' used in the third deposition unit is also formed to correspond to the shape of the third sub-pixel Fr, and the planar area of the third opening 143-4''' may be equal to or greater than the planar area of the third sub-pixel Fr. Furthermore, the planar area of the third opening 143-4''' may be equal to or greater than the planar area of the third intermediate layer 28-2C'''.

In one or more embodiments, the first sub-pixel F1''', the second sub-pixel F2''' and the third sub-pixel Fr may be similar to those described with reference to FIG. 14. A relationship among the first intermediate layer 28-2A''', the second intermediate layer 28-2B''', and the third intermediate layer 28-2C''' may be the same as the relationship among the first sub-pixel F1''', the second sub-pixel F2''', and the third sub-pixel Fr.

For example, centers of some of a plurality of second sub-pixels F2''' may be arranged in a straight line in one direction, and centers of the other ones of the plurality of second sub-pixels F2''' may be arranged in a serpentine shape in another direction. Furthermore, centers of a portion of a plurality of third sub-pixels Fr may be arranged in a straight line, and centers of another portion of the plurality of third sub-pixels F3''' may be arranged in a serpentine shape in another direction. Centers of a plurality of first sub-pixels F1''' may be in a straight line in a direction different from the one direction.

In one or more embodiments, the second sub-pixel F2''' and the third sub-pixel F3''' facing the same first sub-pixel F1''' may be tilted in opposite directions with respect to a tensile direction of the second mask sheet 133-2''' and an extension direction of the third mask sheet 143-2''. In one or more embodiments, the second sub-pixels F2''' adjacent to each other may form an angle of 45 degrees or about 45 degrees with respect to the tensile direction of the second mask sheet 133-2''' in opposite directions, respectively. Also, the second openings 133-4''' formed in the second mask sheet 133-2''' and adjacent to each other may form an angle of 45 degrees or about 45 degrees with respect to the tensile direction of the second mask sheet 133-2''. The third sub-pixels F3''' adjacent to each other may form an angle of 45 degrees or about 45 degrees with respect to the tensile direction of the third mask sheet 143-2''' in opposite directions, respectively. Also, the third openings 143-4''' formed in the third mask sheet 143-2''' and adjacent to each other may form an angle of 45 degrees or about 45 degrees with respect to the tensile direction of the third mask sheet 143-2''. The second intermediate layer 28-2B''' and the third intermediate layer 28-2C''' may be arranged on the display substrate at positions corresponding to the second opening 133-4''' and the third opening 143-4''', respectively.

The display device may be fixed or attached to a device or the like that can be operated by a user such as a vehicle. The display device may be fixed or attached to the device to form a certain angle different from 0 degrees between a user's viewing direction and the first direction or the second direction. For example, the display device may be arranged such that the user's viewing direction of the display device and the first direction or the second direction form an angle of 90 degrees.

In the above case, when a user looks at the display device, an inclined portion of the pixel-defining layer is not perpendicular or normal to the user's viewing direction. Accordingly, external light may be prevented or substantially prevented from being reflected through the inclined portion of the pixel-defining layer and incident on the user's eyes. In other words, the inclined portion may prevent or substantially prevent external light being reflected into the user's eyes.

Further, the display device may implement (or provide) a precise image through each sub-pixel.

According to the display device manufacturing apparatus and the display device manufacturing method, it is possible to manufacture the display device having an accurate deposition pattern.

Furthermore, according to the display device manufacturing apparatus and the display device manufacturing method, it is possible to reduce an error between a design pattern and an actual deposition pattern that may occur during manufacturing.

The shape in which corner portions of the sub-pixels shown in FIG. 17 are chamfered is not limited to that shown FIG. 17 and may be applied to any of the embodiments described above.

The display device according to embodiments may prevent or reduce glare by reducing external light reflection. The display device manufacturing apparatus according to embodiments may form various suitable layers on a display substrate through chambers arranged in an in-line form.

Furthermore, the mask assembly and the display device manufacturing apparatus according to embodiments may simplify a process and reduce a process time.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims, and equivalents thereof.

What is claimed is:

1. A display device comprising:
a first sub-pixel having a quadrangular shape;
a second sub-pixel facing a first side of the first sub-pixel, the second sub-pixel having a quadrangular shape; and
a third sub-pixel facing the first side of the first sub-pixel and spaced apart from the second sub-pixel, the third sub-pixel having a quadrangular shape,
wherein a distance from the first side of the first sub-pixel to the second sub-pixel and a distance from the first side of the first sub-pixel to the third sub-pixel are different from each other, and
wherein:
an outline connecting a portion of an edge of the second sub-pixel to a portion of an edge of the third sub-pixel is square; and/or
the display device further comprises:
a plurality of first sub-pixels comprising the first sub-pixel, the plurality of first sub-pixels including centers arranged in a straight line in a first direction and arranged in a serpentine shape in a second direction;
a plurality of first sub-pixels comprising the first sub-pixel arranged in a first direction, wherein the second sub-pixel facing the first side of the first sub-pixel and one of another second sub-pixel or another third sub-pixel facing a second side of the first sub-pixel are symmetrical to each other about a straight line crossing centers of the plurality of first sub-pixels arranged in the first direction;
a spacer between the first sub-pixel and the second sub-pixel or between the first sub-pixel and the third sub-pixel; and/or
a plurality of first sub-pixels comprising the first sub-pixel arranged in a first direction, wherein a long side of the second sub-pixel or a long side of the third sub-pixel forms an angle of about 45 degrees with respect to a straight line crossing centers of the plurality of first sub-pixels arranged in the first direction.

2. The display device of claim 1, wherein at least a side portion of the second sub-pixel and at least a side portion of the third sub-pixel are within a length range of the first side of the first sub-pixel.

3. The display device of claim 1, wherein a short side of the second sub-pixel is parallel to the first side of the first sub-pixel.

4. The display device of claim 1, wherein a short side of the third sub-pixel is parallel to the first side of the first sub-pixel.

5. The display device of claim 1, further comprising the plurality of first sub-pixels comprising the first sub-pixel, the plurality of first sub-pixels including the centers arranged in the straight line in the first direction and arranged in the serpentine shape in the second direction.

6. The display device of claim 5, wherein each of the plurality of first sub-pixels is configured to emit green light.

7. The display device of claim 5, wherein the first direction is a direction parallel to a long side of the display device.

8. The display device of claim 1, further comprising a plurality of second sub-pixels comprising the second sub-pixel and a plurality of third sub-pixels comprising the third sub-pixel,
wherein centers of first ones of the plurality of second sub-pixels or first ones of the plurality of third sub-pixels are arranged in a straight line.

9. The display device of claim 1, further comprising a plurality of second sub-pixels comprising the second sub-pixel and a plurality of third sub-pixels comprising the third sub-pixel,
wherein centers of first ones of the plurality of second sub-pixels or first ones of the plurality of third sub-pixels are arranged in a serpentine shape in one direction.

10. The display device of claim 1, further comprising the plurality of first sub-pixels comprising the first sub-pixel arranged in the first direction,
wherein the second sub-pixel facing the first side of the first sub-pixel and the one of the another second sub-pixel or the another third sub-pixel facing the second side of the first sub-pixel are symmetrical to each other about the straight line crossing the centers of the plurality of first sub-pixels arranged in the first direction.

11. The display device of claim 1, wherein a length of a long side of the second sub-pixel and a length of a long side of the third sub-pixel are substantially equal to each other.

12. The display device of claim 1, further comprising the spacer between the first sub-pixel and the second sub-pixel or between the first sub-pixel and the third sub-pixel.

13. The display device of claim 12, wherein a shortest distance from the second sub-pixel to the spacer is substantially equal to a shortest distance from another third sub-pixel to the spacer.

14. The display device of claim 1, wherein a short side of the second sub-pixel or a short side of the third sub-pixel overlaps one side of the first sub-pixel and is arranged in a straight line extending from one side of another first sub-pixel.

15. The display device of claim 1, further comprising the plurality of first sub-pixels comprising the first sub-pixel arranged in the first direction,
wherein the long side of the second sub-pixel or the long side of the third sub-pixel forms the angle of about 45 degrees with respect to the straight line crossing the centers of the plurality of first sub-pixels arranged in the first direction.

16. The display device of claim 1, wherein an area of the first sub-pixel is greater than at least one of an area of the second sub-pixel or an area of the third sub-pixel.

17. The display device of claim 1, wherein an area of the second sub-pixel and an area of the third sub-pixel are different from each other.

18. The display device of claim 1, wherein the outline connecting the portion of the edge of the second sub-pixel to the portion of the edge of the third sub-pixel is square.

19. The display device of claim 1, wherein a vertex of at least one of the first sub-pixel, the second sub-pixel, or the third sub-pixel is chamfered.

20. The display device of claim 1, wherein the first sub-pixel is configured to emit blue light, one of the second sub-pixel or the third sub-pixel is configured to emit red light, and the other of the second sub-pixel or the third sub-pixel is configured to emit green light.

21. A display device comprising:
a plurality of first intermediate layers having quadrangular shapes and spaced apart from each other;
a plurality of second intermediate layers having quadrangular shapes and spaced apart from each other, the plurality of second intermediate layers facing the plurality of first intermediate layers, respectively; and
a plurality of third intermediate layers having quadrangular shapes and spaced apart from each other, the plurality of third intermediate layers facing the plurality of first intermediate layers, respectively, and being spaced apart from the plurality of second intermediate layers,
wherein a distance from a side of each of the first intermediate layers to each of the second intermediate layers and a distance from the side of each of the first intermediate layers to each of the third intermediate layers are different from each other, and
wherein:
the display device further comprises a spacer between the first intermediate layer and the second intermediate layer or between the first intermediate layer and the third intermediate layer; and/or
shortest distances between second intermediate layers, which face a same first intermediate layer, from among the plurality of second intermediate layers, and the same first intermediate layer, or shortest distances between third intermediate layers, which face a same first intermediate layer, from among the plurality of third intermediate layers, and the same first intermediate layer are different from each other.

22. The display device of claim 21, wherein the first intermediate layer, the second intermediate layer, and the third intermediate layer comprise materials to emit light of different colors in response to power supplied to each of the first, second and third intermediate layers.

23. The display device of claim 21, wherein the second intermediate layer and the third intermediate layer are parallel to each other.

24. The display device of claim 21, wherein centers of first ones of the plurality of second intermediate layers or centers of first ones of the plurality of third intermediate layers are arranged in a straight line.

25. The display device of claim 21, wherein a length of a long side of the second intermediate layer and a length of a long side of the third intermediate layer are substantially equal to each other.

26. The display device of claim 21, further comprising the spacer between the first intermediate layer and the second intermediate layer or between the first intermediate layer and the third intermediate layer.

27. The display device of claim 21, wherein the shortest distances between the second intermediate layers, which face the same first intermediate layer, from among the plurality of second intermediate layers, and the same first intermediate layer, or the shortest distances between the third intermediate layers, which face the same first intermediate layer, from among the plurality of third intermediate layers, and the same first intermediate layer are different from each other.

28. A mask assembly comprising:
a mask frame; and a plurality of mask sheets on the mask frame under tension and sequentially arranged along a side of the mask frame, wherein each of the plurality of mask sheets includes a plurality of openings, wherein a first one of the plurality of openings is tilted in one direction with respect to a tensile direction of the mask sheet, a second one of the plurality of openings is tilted in a different direction from the first one of the plurality of openings, and centers of at least the first one, the second one, and a third one of the plurality of openings are arranged in a serpentine shape in a direction perpendicular to the tensile direction, and wherein the first one and the second one overlap each other in the direction perpendicular to the tensile direction.

29. The mask assembly of claim 28, wherein each of the plurality of openings is at an angle of about 45 degrees with respect to the tensile direction of the mask sheet.

30. The mask assembly of claim 28, wherein centers of openings in the tensile direction of the mask sheet or the direction perpendicular to the tensile direction of the mask sheet from among the plurality of openings are arranged in a line.

31. The mask assembly of claim 28, wherein the plurality of openings are rectangular.

32. The mask assembly of claim 31, wherein a vertex of each of the plurality of openings is chamfered.

33. An apparatus for manufacturing a display device, the apparatus comprising:
a chamber configured to receive a display substrate;
a deposition source in the chamber, the deposition source being configured to supply a deposition material into the chamber; and
a mask assembly configured to face the deposition source and via which the deposition material passes to the display substrate in a pattern form,
wherein the mask assembly comprises:
a mask frame; and
a plurality of mask sheets arranged on the mask frame under tension and sequentially arranged along a side of the mask frame,
wherein each of the plurality of mask sheets includes a plurality of openings,
wherein a first one of the plurality of openings is tilted in one direction with respect to a tensile direction of the mask sheet, a second one of the plurality of openings is tilted in a different direction from the first one of the plurality of openings, and centers of at least the first one, the second one, and a third one of the plurality of openings are arranged in a serpentine shape in a direction perpendicular to the tensile direction, and
wherein the first one and the second one overlap each other in the direction perpendicular to the tensile direction.

34. The apparatus of claim 33, wherein each of the plurality of openings is at an angle of about 45 degrees with respect to the tensile direction.

35. The apparatus of claim 33, wherein centers of openings arranged in the tensile direction of the mask sheet or the direction perpendicular to the tensile direction of the mask sheet from among the plurality of openings are arranged in a line.

36. The apparatus of claim 33, wherein the plurality of openings are rectangular.

37. The apparatus of claim 36, wherein a vertex of each of the plurality of openings is chamfered.

38. A display device comprising:
a first sub-pixel;
a second sub-pixel facing the first sub-pixel;
a third sub-pixel facing the first sub-pixel and spaced apart from the second sub-pixel; and
a spacer between the first sub-pixel and the second sub-pixel or between the first sub-pixel and the third sub-pixel,
wherein a distance from a side of the first sub-pixel facing the second sub-pixel and the third sub-pixel to the second sub-pixel is different from a distance from the side of the first sub-pixel to the third sub-pixel.

39. The display device of claim 38, wherein a size of the second sub-pixel is substantially equal to a size of the third sub-pixel.

40. The display device of claim 38, wherein a size of the second sub-pixel is different from a size of the third sub-pixel.

41. The display device of claim 38, wherein each of the second sub-pixel and the third sub-pixel are rectangular,
wherein a length of a long side of the second sub-pixel and a length of a long side of the third sub-pixel are substantially equal to each other.

42. The display device of claim 38, wherein a shortest distance from an edge of the spacer to the second sub-pixel and a shortest distance from the edge of the spacer to another third sub-pixel are substantially equal to each other.

43. The display device of claim 38, wherein a shortest distance between one of the second sub-pixel or another third sub-pixel and an edge of the spacer is substantially equal to a shortest distance between the first sub-pixel and an edge of the spacer.

44. The display device of claim 38, wherein each of the second sub-pixel and the third sub-pixel are rectangular,
wherein a distance between long sides of another first sub-pixel and the second sub-pixel facing each other, a distance between a long side of the second sub-pixel and a long side of the third sub-pixel facing each other, and a distance between a long side of the third sub-pixel and another first sub-pixel facing each other are substantially equal to one another.

45. A display device comprising:
a first unit pixel including a first sub-pixel, a second sub-pixel, and a third sub- pixel of different respective colors; and
a second unit pixel adjacent to the first unit pixel, the second unit pixel including a first sub-pixel, a second sub-pixel, and a third sub-pixel, the first, second, and third sub- pixels being configured to emit different colors,
wherein the first sub-pixel of the first unit pixel and the first sub-pixel of the second unit pixel each emit light of a first color, the second sub-pixel of the first unit pixel and the second sub-pixel of the second unit pixel each emit light of a second color, and the third sub-pixel of the first unit pixel and the third sub-pixel of the second unit pixel each emit light of a third color,
wherein a first emission layer corresponding to the first sub-pixel of the first unit pixel includes a first side and a second side crossing the first side, the second and third sub-pixels of the first unit pixel are arranged to face the first side of the first emission layer, and the second and third sub-pixels of the second unit pixel are arranged to face the second side of the first emission layer, and
wherein a distance between the first emission layer corresponding to the first sub-pixel of the first unit pixel and the second sub-pixel of the first unit pixel is different from a distance between the first emission layer corresponding to the first sub-pixel of the first unit pixel and the third sub-pixel of the first unit pixel.

46. The display device of claim 45, wherein:
an area of the second sub-pixel of the first unit pixel is different from an area of the third sub-pixel of the first unit pixel, and
an area of the second sub-pixel of the second unit pixel is different from an area of the third sub-pixel of the second unit pixel.

47. The display device of claim 45, wherein a vertex of at least one selected from the first sub-pixel, the second sub-pixel, and the third sub-pixel is chamfered.

48. The display device of claim 45, wherein:
each of the second sub-pixels of the first and second unit pixels has a substantially rectangular shape, and
each of the third sub-pixels of the first and second unit pixels has a substantially rectangular shape.

49. The display device of claim 45, wherein:
each of the second sub-pixels of the first and second unit pixels has a width and a length, wherein the length of each of the second sub-pixels is greater than the width of each of the second sub-pixels, and
each of the third sub-pixels of the first and second unit pixels has a width and a length, wherein the length of each of the third sub-pixels is greater than the width of each of the third sub-pixels.

50. The display device of claim 45, wherein:
a center of the first sub-pixel of the first unit pixel and a center of the first sub-pixel of the second unit pixel are arranged along a first imaginary straight line, and
sides of the second sub-pixels of the first and second unit pixels and sides of the third sub-pixels of the first and second unit pixels extend along directions crossing the first imaginary straight line.

51. The display device of claim 45, wherein a first imaginary line connecting a center of the second sub-pixel of the first unit pixel and a center of the second sub-pixel of the second unit pixel crosses a second imaginary line connecting a center of the third sub-pixel of the first unit pixel and a center of the third sub-pixel of the second unit pixel.

52. The display device of claim 45, further comprising an additional first emission layer corresponding to the first sub-pixel of the second unit pixel, wherein:
the first emission layer and the additional first emission layer are arranged in a first direction,
the additional first emission layer includes a first side and a second side crossing the first side, and
a corner portion of the first emission layer between the first side and the second side of the first emission layer and a corner portion of the additional first emission layer between the first side and the second side of the additional first emission layer face each other and are arranged along the first direction.

53. The display device of claim 52, wherein:
the second sub-pixel of the first unit pixel is closer to the first side of the additional first emission layer than the third sub-pixel of the first unit pixel, and
the third sub-pixel of the second unit pixel is closer to the second side of the additional first emission layer than the second sub-pixel of the second unit pixel.

54. The display device of claim 52, wherein:
a long side of the second sub-pixel of the first unit pixel is adjacent to the first side of the additional first emission layer, and a short side of the second sub-pixel of the first unit pixel is adjacent to the first side of the first emission layer, and
a long side of the third sub-pixel of the second unit pixel is adjacent to the second side of the additional first emission layer, and a short side of the third sub-pixel of the second unit pixel is adjacent to the second side of the first emission layer.

* * * * *